# (12) United States Patent
Shibata et al.

(10) Patent No.: US 8,379,445 B2
(45) Date of Patent: Feb. 19, 2013

(54) SEMICONDUCTOR STORAGE DEVICE CAPABLE OF REDUCING ERASURE TIME

(75) Inventors: Noboru Shibata, Kawasaki (JP); Kazunori Kanebako, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 104 days.

(21) Appl. No.: 12/884,400

(22) Filed: Sep. 17, 2010

(65) Prior Publication Data

US 2011/0176362 A1    Jul. 21, 2011

(30) Foreign Application Priority Data

Jan. 20, 2010 (JP) ................................. 2010-010436

(51) Int. Cl.
*G11C 11/34* (2006.01)
(52) U.S. Cl. .................................. 365/185.03
(58) Field of Classification Search ............ 365/185.03, 365/185.29
See application file for complete search history.

(56) References Cited

U.S. PATENT DOCUMENTS 7,995,392 B2 *  8/2011  Shibata ............. 365/185.18
2009/0154252 A1 *  6/2009  Shibata ............. 365/185.22

FOREIGN PATENT DOCUMENTS

| JP | 2002-25283 | 1/2002 |
|----|------------|--------|
| JP | 2002-157890 | 5/2002 |
| JP | 2004-192789 | 7/2004 |
| JP | 2009-163782 | 7/2009 |

* cited by examiner

*Primary Examiner* — Hoai V Ho
*Assistant Examiner* — Pablo Huerta
(74) *Attorney, Agent, or Firm* — Oblon, Spivak, McClelland, Maier & Neustadt, L.L.P.

(57) ABSTRACT

According to one embodiment, a semiconductor storage device includes a memory cell array and a control circuit. The distribution state of the threshold voltages of the memory cells is monitored by the read operation, the distribution state of the threshold voltages of the memory cells after the soft erasure is monitored, and an erase voltage is set based on the monitored results. Thus, the erase voltage can be precisely set without depending on the threshold voltage distribution of the memory cell before the erasure.

23 Claims, 20 Drawing Sheets

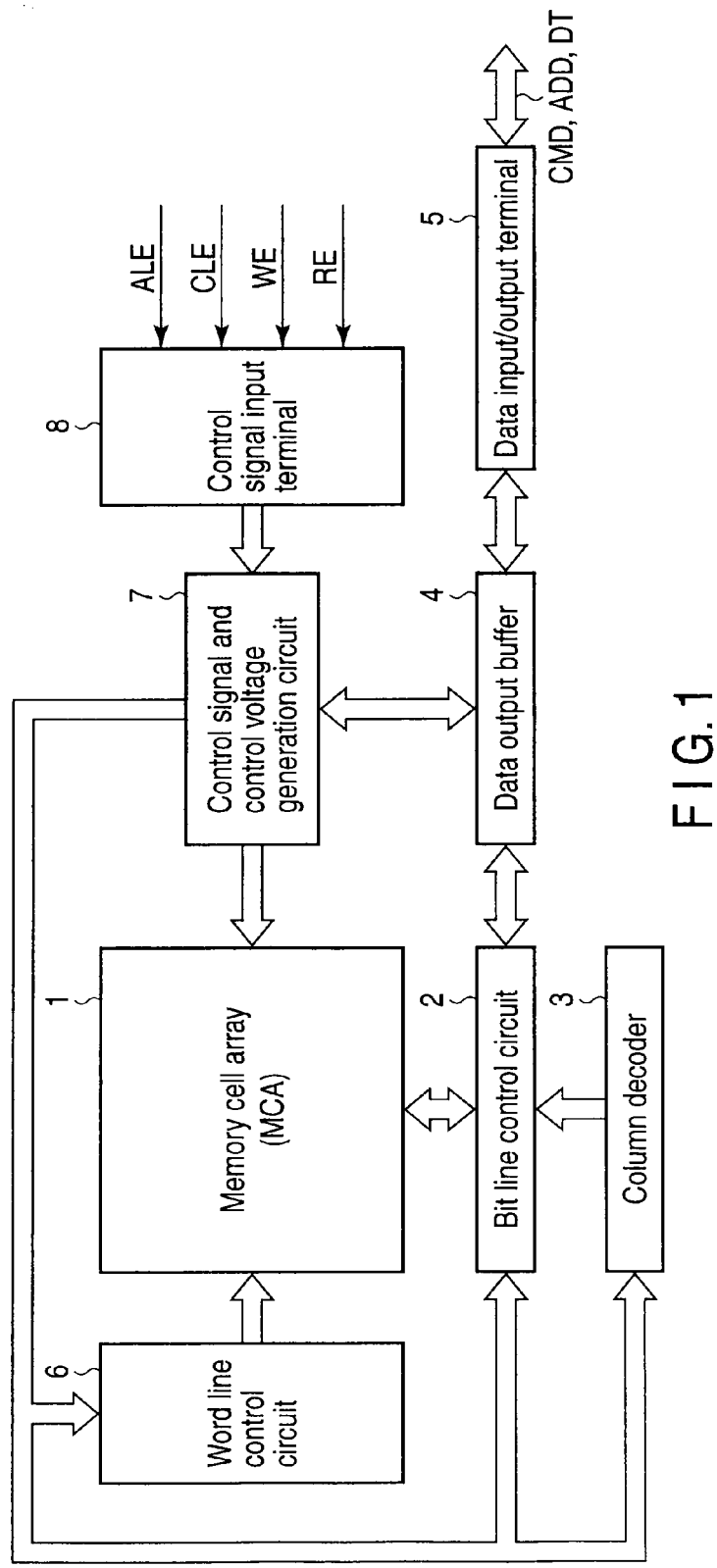
F I G. 1

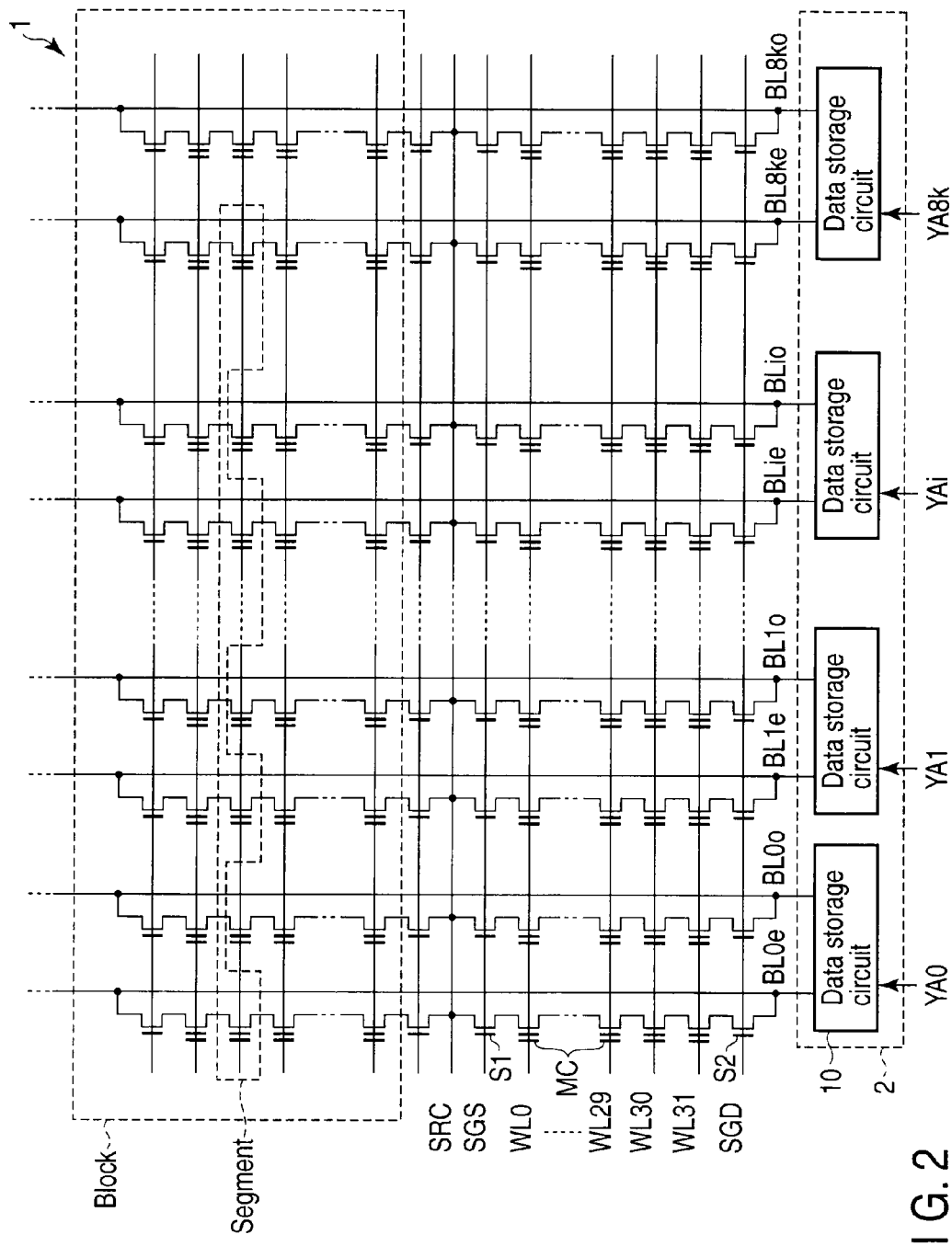
F I G. 2

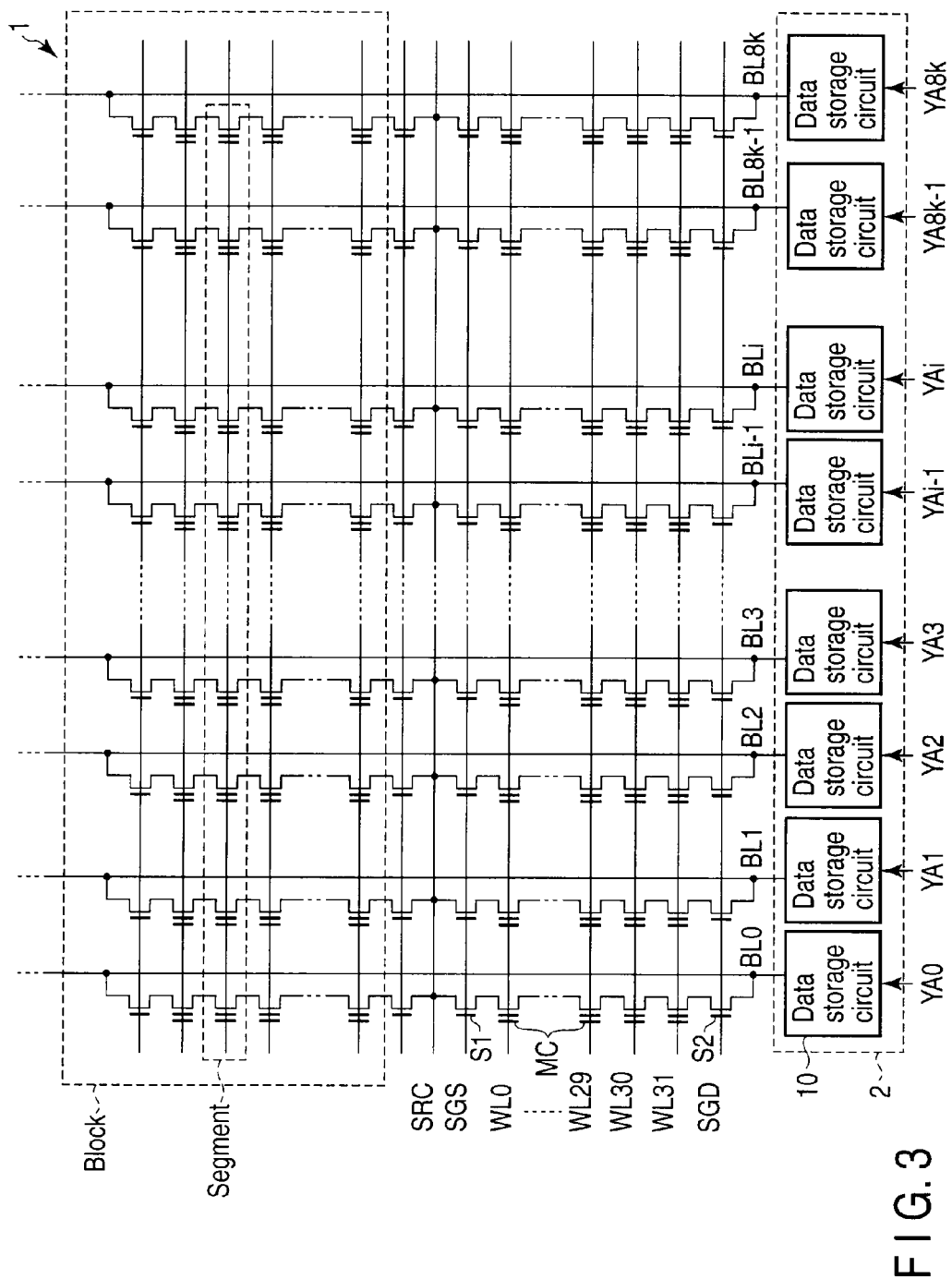
F I G. 3

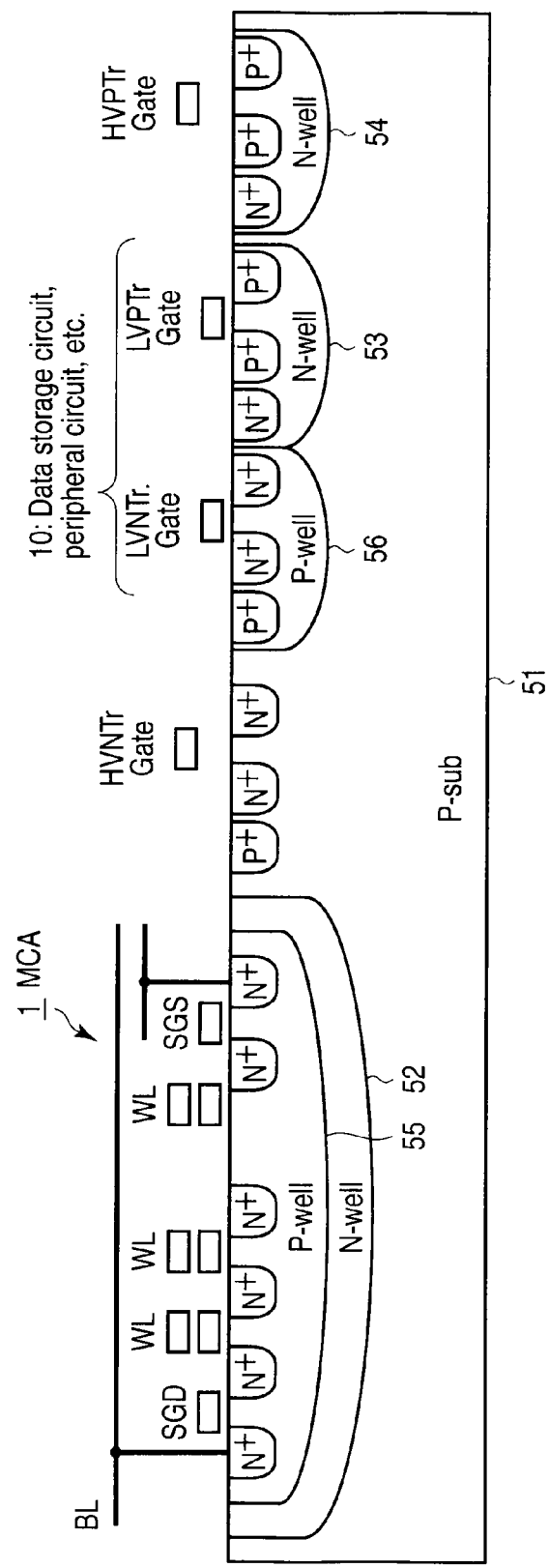
F I G. 5

| | Cell(P-Well) | Cell(N-Well) | H.V.Tr(P-sub) | L.V.Nch(P-well) | L.V.Pch(N-well) | H.V.Pch(N-well) |
|---|---|---|---|---|---|---|
| Erase | Vera(20V) | Vera(20V) | Vss(0V) | Vss(0V) | Vdd(2.5V) | Vdd(2.5V) |
| Program | Vss(0V) | Vss(0V) | Vss(0V) | Vss(0V) | Vdd(2.5V) | Vdd(2.5V)/Vpgmh |
| Read | Vfix(1.6V) | Vfix(1.6V) | Vss(0V) | Vss(0V) | Vdd(2.5V) | Vdd(2.5V)/Vreadh+Vfix |

F I G. 6

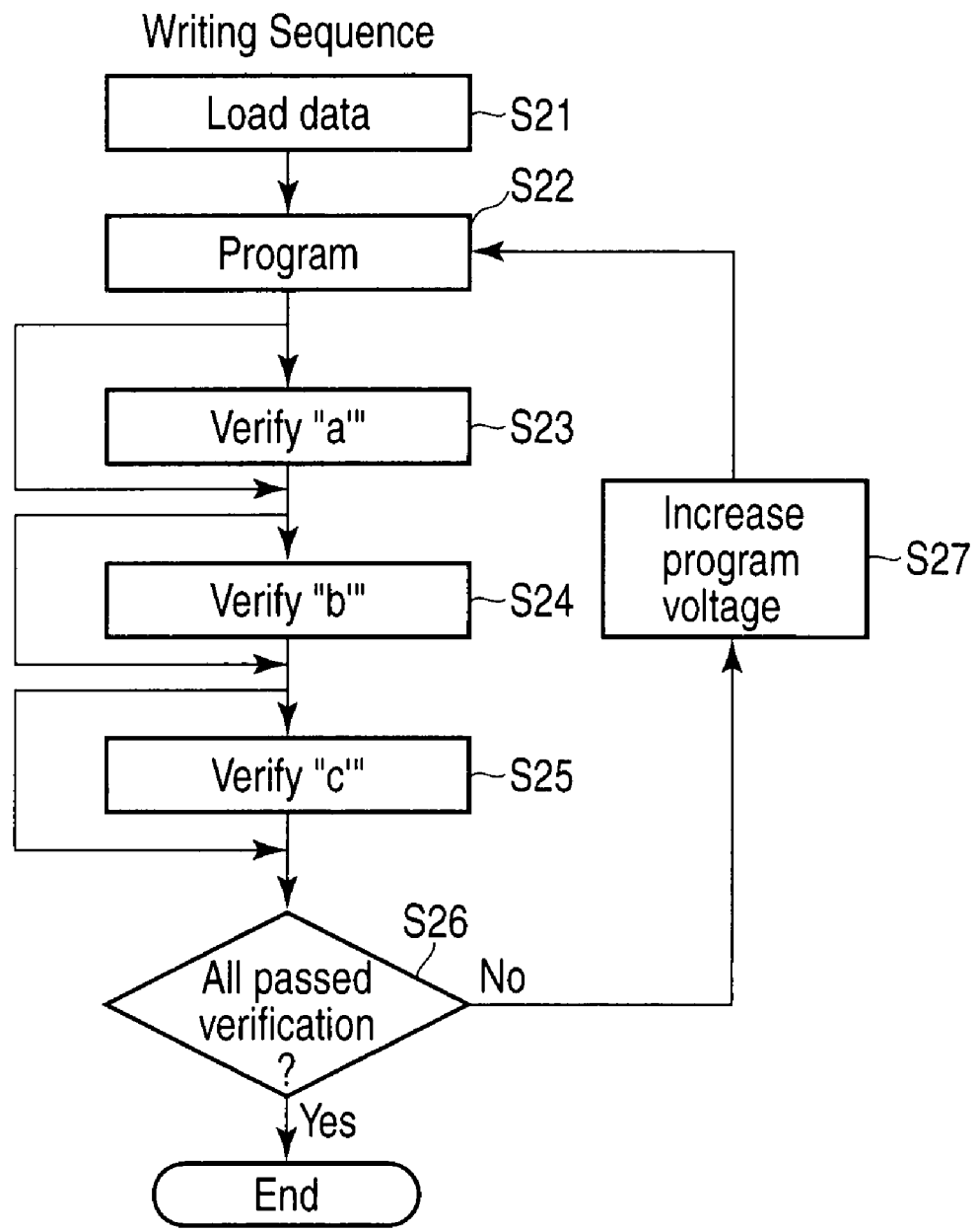
F I G. 1 1

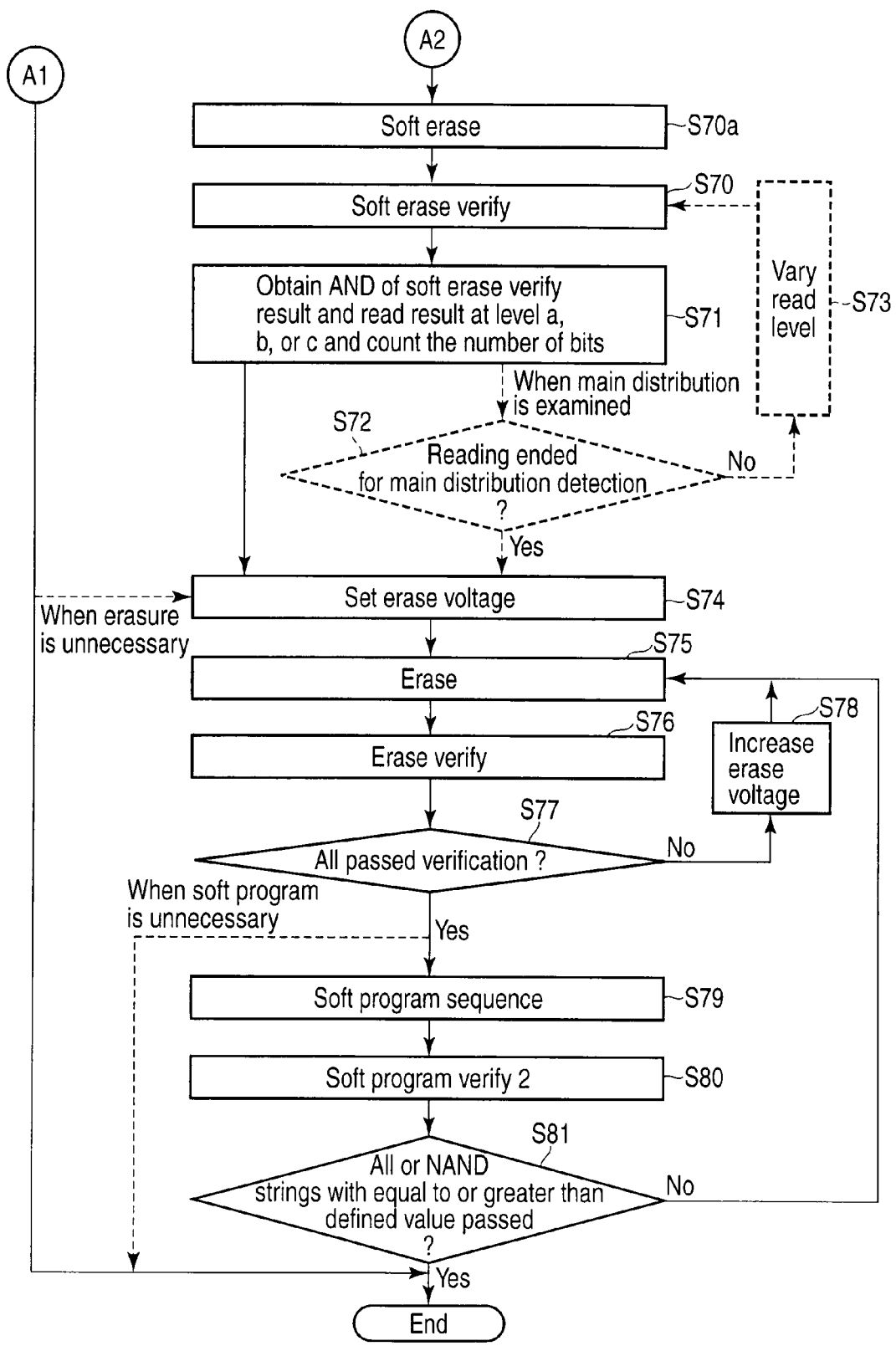
F I G. 20

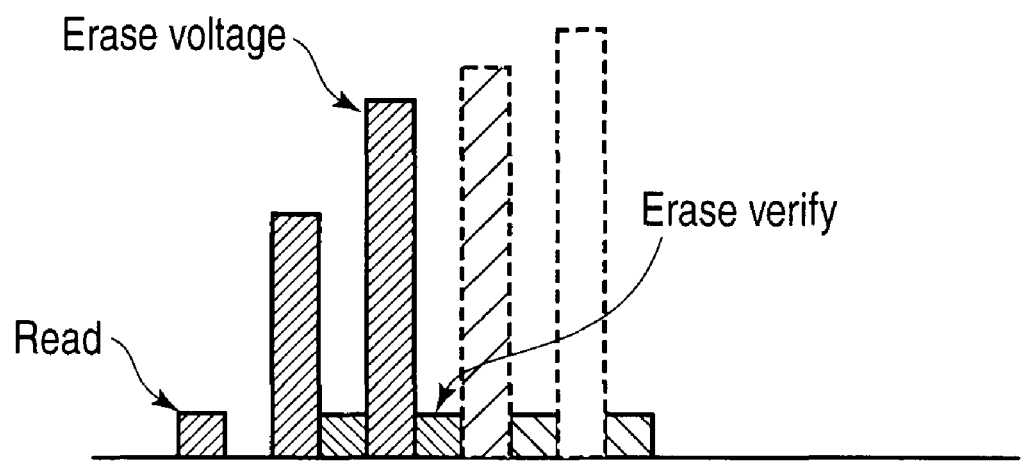
F I G. 21

SEMICONDUCTOR STORAGE DEVICE CAPABLE OF REDUCING ERASURE TIME

CROSS-REFERENCE TO RELATED APPLICATIONS

This application is based upon and claims the benefit of priority from Japanese Patent Application No. 2010-010436, filed Jan. 20, 2010; the entire contents of which are incorporated herein by reference.

FIELD

Embodiments described herein relate generally to semiconductor storage devices, and more specifically, to a NAND flash memory that stores multi-level data.

BACKGROUND

In a NAND flash memory, all or half the number of a plurality of cells connected to a selected word line are connected to the respective bit lines, and data writing or reading is performed collectively on all or half the number of cells (such as cells of 2-4 kB) arranged in a row direction collectively, using a latch circuit connected to the bit lines.

In a NAND flash memory, a threshold voltage of a memory cell is set to a negative value during an erase operation, and is set to a positive value when electrons are injected into the memory cell during a write operation. The erase operation is performed in block units (by the unit of 1 MB, for example) and all the cells included in a plurality of NAND strings are erased simultaneously (see Jpn. Pat. Appln. KOKAI Publication No. 2004-192789).

Since the threshold voltage becomes a large negative value after the erase operation, if the erasure is performed deeply, a stress is applied to the cell and degrades the cell. This results in deterioration in data retention properties. Accordingly, the erasure needs to be performed shallowly, such that the threshold voltage takes a negative value as small as possible. When erasure is performed shallowly, it is possible to perform the erasure little by little by making the erase voltage low and increasing the erase voltage gradually. In this case, however, since the erasure time increases and erasure pulses are applied to the cell many times, a stress is applied to the cell.

In order to suppress the number of times of over-erase and erasure and suppress deep erasure due to over-erase, the methods as will be described below have been proposed. The first proposal is an approach of performing soft erasure of erasing cells at a low erase voltage, counting the number of erased cells, setting an erase voltage according to the number of erased cells, and performing the next erase operation (see Jpn. Pat. Appln. KOKAI Publication No. 2002-25283, for example). The second proposal is an approach of performing a read operation a plurality of times by varying the verify level during soft erase verification after the soft erasure, examining the center of threshold voltage distribution, setting an erase voltage according to the level of the center of the threshold voltage distribution, and then performing the next erase operation (see Jpn. Pat. Appln. KOKAI Publication No. 2002-157890, for example). Furthermore, as a related technique, a semiconductor storage device capable of reducing the erasure time by reducing the number of times of erasure pulse application and thereby improving precision in erase verification has been proposed (see Jpn. Pat. Appln. KOKAI Publication No. 2009-163782, for example (hereinafter referred to as Patent Document 4)).

However, distribution of threshold voltages of memory cells after soft erasure is not constant, and is dependent upon distribution of data stored in the memory cells before the erasure. It is therefore difficult to precisely set the next erase voltage after the soft erasure and to precisely perform the erasure by reducing the erasure time, according to the above-described approaches. A demand is therefore made for a semiconductor memory device capable of precisely setting the next erase voltage after the soft erasure.

BRIEF DESCRIPTION OF THE DRAWINGS

FIG. 1 is a configuration example illustrating an example of a semiconductor storage device according to an embodiment;

FIG. 2 is a circuit diagram illustrating an example of a memory cell array and a bit line control circuit shown in FIG. 1;

FIG. 3 is a circuit diagram illustrating another example of the memory cell array and the bit line control circuit shown in FIG. 1;

FIG. 5 is a cross-sectional view schematically illustrating a semiconductor storage device according to an embodiment;

FIG. 6 illustrates an example of voltages that are supplied to members of the memory cell;

FIG. 11 is a flowchart schematically illustrating the write operation;

FIG. 20 is a flowchart illustrating a portion of the erase operation according to the second embodiment;

FIG. 21 illustrates the erase operation according to the first embodiment; and

DETAILED DESCRIPTION

Figures 4A, 4B:
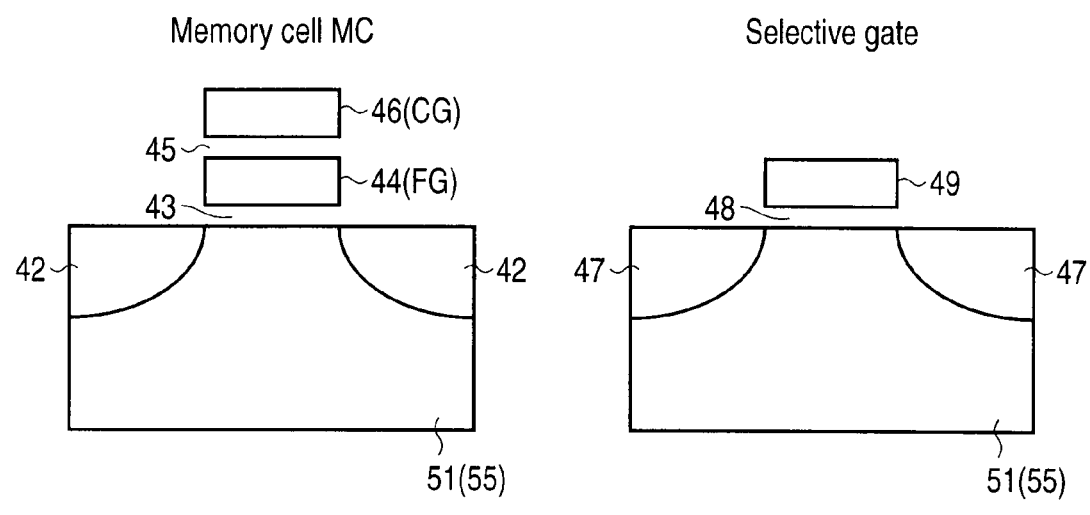
FIG. 4A is a cross-sectional view of a memory cell and FIG. 4B is a cross-sectional view of a select gate.

In general, according to one embodiment, a semiconductor storage device includes a memory cell array and a control circuit. In the memory cell array, a plurality of memory cells connected to a plurality of word lines and a plurality of bit lines are arranged in a matrix. The control circuit controls a potential of each of said plurality of word lines and said plurality of bit lines. The control circuit reads data from a memory cell connected to a selected word line at a first read level before an erase operation, calculates a number "a" of memory cells exceeding the first read level, simultaneously erases n number of memory cells (where n is a natural number equal to or greater than 2) included in the memory cells of the memory cell array using a first erase voltage during the erase operation, performs a verify operation at a first verify level, obtains a number k (k<=a) of cells (where k is a natural number equal to or greater than 1) included in the number "a" and exceeding the first verify level, determines a second erase voltage based on the number "k/a", and performs a second erase operation using the second erase voltage.

Hereinafter, embodiments will be described with reference to the accompanying drawings.

FIG. 1 illustrates a configuration of a semiconductor storage device according to an embodiment, and more specifically, to a NAND flash memory capable of storing 4 levels (2 bits), for example.

A memory cell array 1 includes a plurality of bit lines, a plurality of word lines, and a common source line, and memory cells formed of EEPROM cells, for example, and capable of electrically rewriting data are arranged in a matrix. A bit line control circuit 2, configured to control the bit lines, and a word line control circuit 6 are connected to the memory cell array 1.

The bit line control circuit 2 reads data in the memory cells in the memory cell array 1 via the bit lines, detects the state of the memory cells in the memory cell array 1 via the bit lines, and applies a write control voltage to the memory cells in the memory cell array 1 via the bit lines to write data into the memory cells. A column decoder 3 and a data input/output buffer 4 are connected to the bit line control circuit 2. The data storage circuit in the bit line control circuit 2 is selected by the column decoder 3. Data of the memory cells read to the data storage circuit is output to the outside from a data input/output terminal 5 via a data input/output buffer 4. The data input/output terminal 5 is connected to a host, not shown, outside the memory chip, for example. This host is formed of a microcomputer, for example, and receives data output from the data input/output terminal 5. Further, the host outputs various kinds of commands CMD designed to control the operation of the NAND flash memory, an address ADD, and data DT. The written data input to the data input/output terminal 5 from the host is supplied to the data storage circuit selected by the column decoder 3 via the data input/output buffer 4, and the command and the address are supplied to a control signal and control voltage generation circuit 7.

The word line control circuit 6 is connected to the memory cell array 1. The word line control circuit 6 selects a word line in the memory cell array, reads data from or write data into the selected word line, or applies a voltage required for writing or erasure.

The memory cell array 1, the bit line control circuit 2, the column decoder 3, the data input/output buffer 4, and the word line control circuit 6 are connected to the control signal and control voltage generation circuit 7, and are controlled by the control signal and control voltage generation circuit 7. The control signal and control voltage generation circuit 7 is connected to a control signal input terminal 8, and is controlled by control signals Address Latch Enable (ALE), Command Latch Enable (CLE), Write Enable (WE), and Read Enable (RE).

The bit line control circuit 2, the column decoder 3, the word line control circuit 6, the control signal, and the control voltage generation circuit 7 form a write circuit, a read circuit, and an erase circuit.

FIG. 2 illustrates a configuration of the memory cell array 1 and the bit line control circuit 2 shown in FIG. 1. A plurality of NAND strings are arranged in the memory cell array 1. One NAND string is formed of 32 memory cells MC, for example, connected in series, and select gates S1, S2. Each of the memory cells is formed of EEPROM. The select gate S2 is connected to a bit line BL0e, and the select gate S1 is connected to a source line SRC. The control gates of the memory cells MC arranged in the respective rows are commonly connected to word lines WL0-WL29, WL30, WL31. Further, the select gates S2 are commonly connected to a select line SGD, and select gates S1 are commonly connected to a select line SGS.

The bit line control circuit 2 includes a plurality of data storage circuits 10. A pair of bit lines (BL0e, BL0o), (BL1e, BL1o), . . . (BLie, BLio), (BL8ke, BL8ko) are connected to each of the data storage circuits 10.

The memory cell array 1 includes a plurality of blocks, as shown by the dashed line. Each of the blocks is formed of a plurality of NAND strings, and data is erased in the block units, for example. Further, the erase operation is performed simultaneously on two bit lines connected to the data storage circuit 10.

Further, a plurality of memory cells (memory cells in the range surrounded by the dashed line) arranged in every other bit line and connected to one word line forms one segment. Data is written and read by the segment unit.

In a read operation, a program verify operation, and a program operation, one bit line is selected from two bit lines (BLie, BLio) connected to the data storage circuit 10, according to address signals (YA0, YA1, . . . YAi . . . YA8k) supplied from the outside. Further, one word line is selected according to an external address.

Further, one word line is selected based on the external address, and two pages shown by the dotted line in FIG. 2 are selected. The switching of the two pages is performed by an address. When two bits are stored in one cell, two pages are selected; when three bits are stored in one cell, three pages are selected; and when four bits are stored in one cell, four pages are selected. The erase operation is performed in the block units shown by the dotted line in FIG. 2.

FIG. 3 is a configuration of the case where writing is performed on all the cells arranged in a row direction. In this case, bit lines BL0, BL1, . . . BL8k−1, BL8k are connected to the respective data storage circuits 10, and corresponding address signals YA0, YA1, YA8k−1, and YA8k are supplied to the respective data storage circuits 10.

FIG. 4A is a cross-sectional view of a memory cell and FIG. 4B is a cross-sectional view of a select gate. In FIG. 4A, a source of a memory cell and an n-type diffusion layer 42 as a drain are formed on a substrate 51 (P-type well region 55, which will be described later). A floating gate (FG) 44 is formed on the P-type well region 55 via a gate insulation film 43, and a control gate (CG) 46 is formed on the floating gate 44 via an insulation film 45. In FIG. 4B, an n-type diffusion layer 47 is formed in the P-type well region 55 as a source and drain. On the P-type well region 55, a control gate 49 is formed via a gate insulation film 48.

FIG. 5 is a cross-sectional view of a semiconductor storage device. For example, in the P-type semiconductor substrate 51, N-type well regions 52, 53, 54, and a P-type well region 56 are formed. In the N-type well region 52, a P-type well region 55 is formed, and a low-voltage N-channel transistor LVNTr forming the memory cell array 1 is formed in the P-type well region 55. Further, in the N-type well region 53 and the P-type well region 56, a low-voltage P-channel transistor LVPTr and a low-voltage N-channel transistor LVNTr forming the data storage circuit 10 are formed. In the substrate 51, a high-voltage N-channel transistor HVNTr for connecting the bit lines and the data storage circuit 10 are formed. Further, in the N-type well region 54, a high-voltage P-channel transistor HVPTr forming a word line driving circuit, for example, is formed. As shown in FIG. 5, the high-voltage transistors HVNTr, HVPTr have thick gate insulation films, for example, compared to the low-voltage transistors LVNTr, LVPTr.

FIG. 6 shows an example of voltages supplied to the members shown in FIG. 5 during erasure, programming, and reading of the memory cells.

Figure 7:
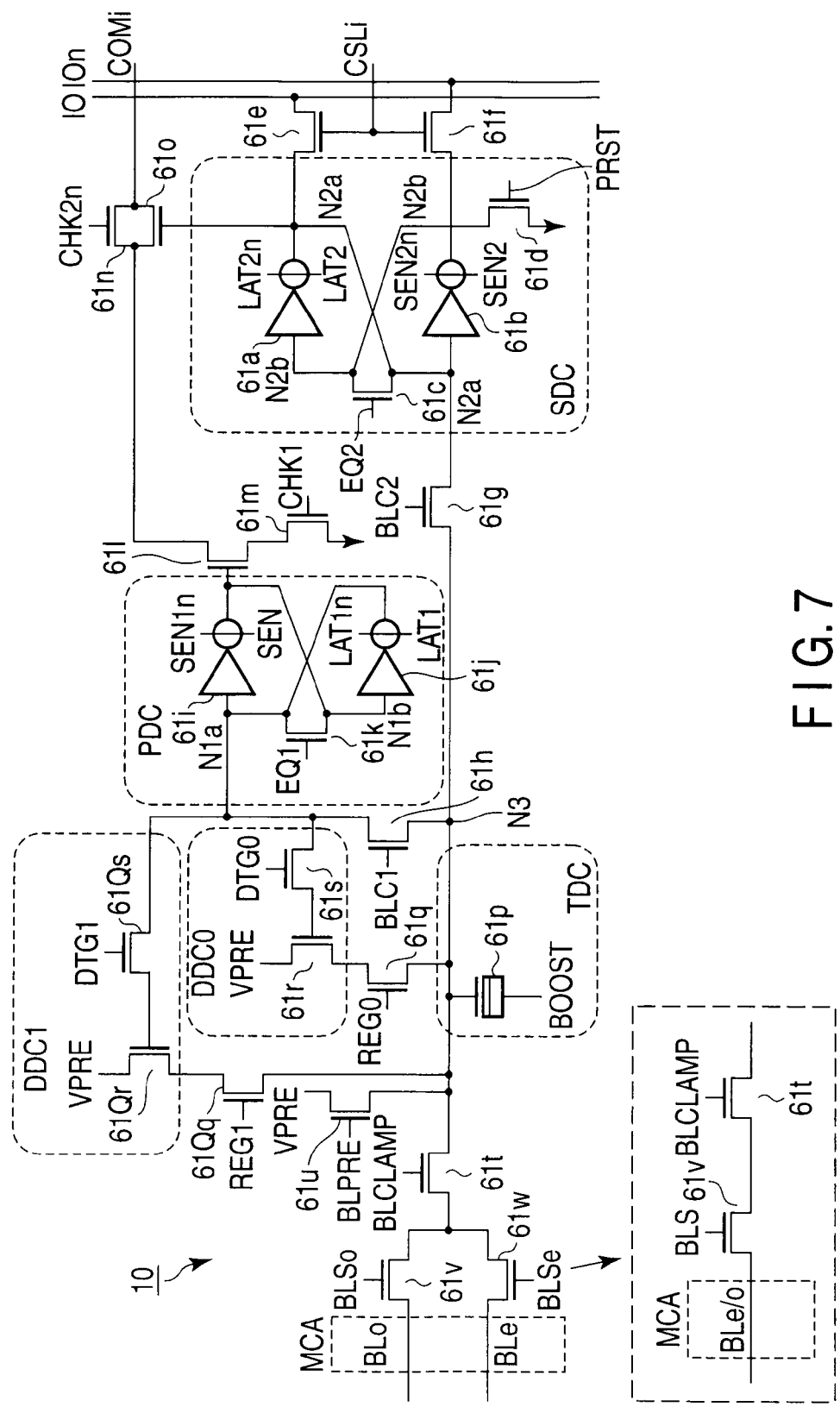
FIG. 7 is a circuit diagram illustrating an example of a data storage circuit 10 shown in FIGS. 2 and 3.

FIG. 7 is a circuit diagram illustrating an example of the data storage circuit 10 shown in FIGS. 2 and 3.

The data storage circuit 10 includes a primary data cache (PDC), a secondary data cache (SDC), a dynamic data cache (DDC0), a dynamic data cache Q (DDC1), and a temporary data cache (TDC). The SDC, the PDC, and the DDC0 hold input data during writing, hold read data during reading, temporarily hold data during verification, and are used for operation of internal data when multi-valued data is stored. The TDC amplifies data on the bit line when data is read, temporarily holds the amplified data, and is used for operation of internal data when multi-valued data is stored.

The SDC is formed of clocked inverter circuits 61a, 61b, forming a latch circuit, and transistors 61c, 61d. The transistor 61c is connected between an input terminal of the clocked inverter circuit 61a and an input terminal of the clocked inverter circuit 61b. A signal EQ2 is supplied to a gate of the transistor 61c. The transistor 61d is connected between an output terminal of the clocked inverter circuit 61b and the ground. A signal PRST is supplied to the gate of the transistor 61d. A node N2a of the SDC is connected to an input/output data line IO via a column select transistor 61e, and a node N2b is connected to an input/output data line IOn via a column select transistor 61f. A column select signal CSLi is supplied to gates of the transistors 61e, 61f. The node N2a of the SDC is connected to a node N1a of the PDC via transistors 61g, 61h. A signal BLC2 is supplied to a gate of the transistor 61g, and a signal BLC1 is supplied to a gate of the transistor 61h.

The PDC is formed of clocked inverter circuits 61i, 61j, and a transistor 61k. The transistor 61k is connected between an input terminal of the clocked inverter circuit 61i and an input terminal of the clocked inverter circuit 61j. A signal EQ1 is supplied to a gate of the transistor 61k. A node N1b of the PDC is connected to a gate of a transistor 61l. One terminal of a current path of the transistor 61l is grounded via a transistor 61m. A signal CHK1 is supplied to the gate of the transistor 61m. Further, the other terminal of the current path of the transistor 61l is connected to one terminal of the current path of transistors 61n, 61o forming a transfer gate. A signal CHK2n is supplied to a gate of the transistor 61n. Further, a gate of the transistor 61o is connected to an output terminal of the clocked inverter circuit 61a. A wiring COMi is connected to the other terminal of the current path of the transistors 61n, 61o. The wiring COMi is a wiring common to all the data storage circuits 10, and the potential of the wiring COMi becomes a high level when verification has been completed on all the data storage circuits 10. That is, as will be described later, when the verification has been completed, the node N1b of the PDC becomes a low level. In this state, when the signals CHK1, CHK2n are set to a high level, if the verification has been completed, the potential of the wiring COMi becomes a high level.

Further, the TDC is formed of a MOS capacitor 61p, for example. One end of the capacitor 61p is connected to a connection node N3 of the transistors 61g, 61h, and a signal BOOST is supplied to the other terminal. Further, the DDC0 is connected to the connection node N3 via a transistor 61q. A signal REG0 is supplied to a gate of the transistor 61q.

The DDC0 is formed of transistors 61r, 61s. A signal VPRE is supplied to one terminal of a current path of the transistor 61r, and the other terminal is connected to a current path of the transistor 61q. A gate of the transistor 61r is connected to the node N1a of the PDC via the transistor 61s. A signal DTG0 is supplied to a gate of the transistor 61s.

The DDC1 is formed of transistors 61Qr, 61Qs. A signal VPRE is supplied to one terminal of a current path of the transistor 61Qr, and the other terminal is connected to the connection node N3 via a transistor 61Qq. A signal REG1 is supplied to a gate of the transistor 61Qq. A gate of the transistor 61Qr is connected to a node N1a of the PDC via the transistor 61Qs. A signal DTG1 is supplied to a gate of the transistor 61Qs.

Further, one terminal of a current path of the transistors 61t, 61u is connected to the connection node N3. A signal VPRE is supplied to the other terminal of the current path of the transistor 61u, and BLPRE is supplied to a gate of the transistor 61u. A signal BLCLAMP is supplied to a gate of a transistor 61t. The other terminal of the transistor 61t is connected to one terminal of a bit line BLo via a transistor 61v, and is connected to one terminal of a bit line BLe via a transistor 61w.

The above-described signals and voltages are generated by the control signal and control voltage generation circuit 7 shown in FIG. 1, and, under the control of the control signal and control voltage generation circuit, the following operation is controlled.

FIG. 7 shows the data storage circuit 10 shown in FIG. 2, and has the same configuration as that of the data storage circuit 10 shown in FIG. 3, except for connection to the bit lines. More specifically, as shown by the dashed line in FIG. 7, only a transistor 61v, for example, is connected to the other terminal of the transistor 61t, and a bit line BLe or BLo is connected via a transistor 61v.

The present memory is a multi-level memory, and is capable of storing two-bit data in one cell. Switching of the two bits is performed by addresses (first page, second page). When two bits are stored in one cell, two pages are used. When three bits are stored in one cell, three pages are used and are switched by an address (first page, second page, third page). Further, when four bits are stored in one cell, four pages are used, and are switched by addresses (first page, second page, third page, fourth page).

Figure 8A:
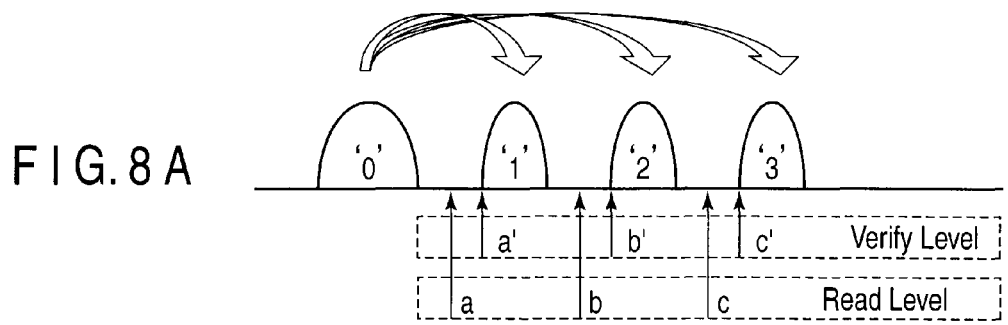
FIG. 8A illustrates the relationship between the threshold voltage distribution of the memory cell, the read level, and the verify level.

FIG. 8A shows the relationship between data of a memory cell and the threshold voltage of the memory cell. Hereinafter, the 4-levels case will be described, where two bits are stored in one cell.

When an erase operation is performed, the data of the memory cell becomes "0". When writing is performed on the first and second pages, the data of the memory cell becomes data "0", "1", "2", and "3". In this example, data of the memory cell is defined from the lower to higher threshold voltages.

(Read Operation)

As shown in FIG. 8A, when writing is performed, data of the memory cell is either in "0", "1", "2", and "3". Accordingly, the levels "a", "b", "c" are used during the read operation. Each of these levels "a", "b", and "c" is an approximately intermediate potential of each of the threshold voltage distributions.

Figure 9:
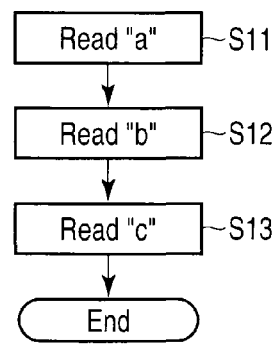
FIG. 9 is a flowchart schematically illustrating the read operation.

FIG. 9 illustrates a flowchart of a read operation. During reading, data of a selected cell is sequentially read at the read levels "a", "b", and "c" (steps S11, S12, S13). Thereby, two-bit data can be read from the cell.

Figure 10:
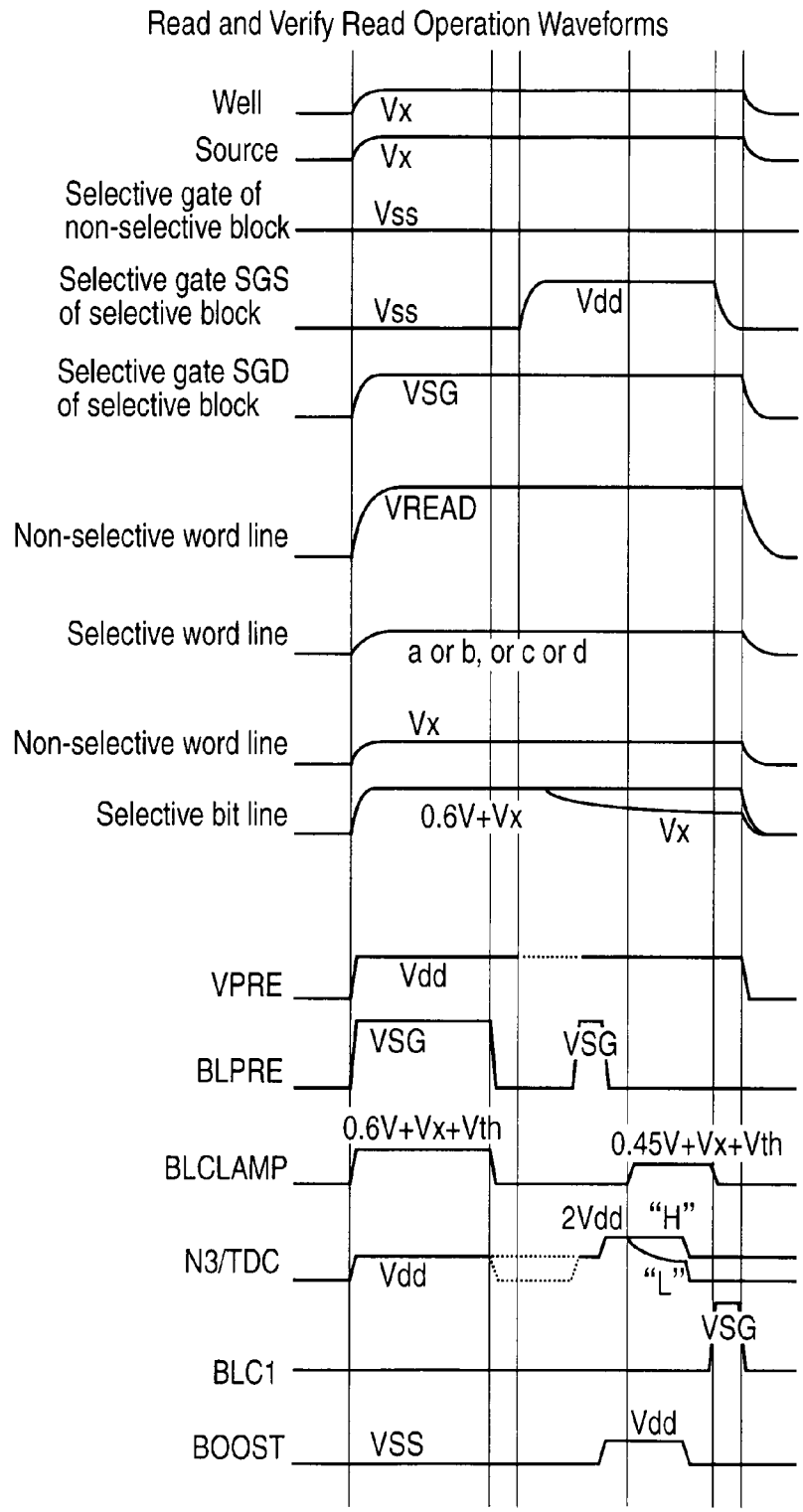
FIG. 10 is a waveform chart illustrating the read and verify operations.

FIG. 10 illustrates waveforms of read and verify operations. First, a well, a source line, and a non-selective bit line of the selective cell are set to 0V.

Potentials "a", "b", "c" ("a"=0, for example) during reading are supplied to the selective word line. At the same time, a voltage Vread is supplied to a non-selective word line of the selected block, a voltage VSG (Vdd+Vth+Vx) is supplied to the select line SGD of the selected block, and a voltage Vss (such as the ground voltage) is supplied to the select line SGS. Further, the signal VPRE of the data storage circuit 10 shown in FIG. 10 is temporarily set to Vdd (2.5V, for example), the signal BLPRE is temporarily set to the voltage VSG, the signal BLCLAMP is set to (0.6V+Vth+Vx), for example, and the bit line is precharged to (0.6V+Vx), for example.

Next, the select line SGS on the source side of the cell is set to the voltage VSG. When the threshold voltage of the cell is higher than the potential "a", "b", or "c" (a=0V, for example), the cell is turned off and the bit line remains at a high level (0.6V+Vx, for example). Further, when the threshold voltage of the cell is lower than the potential "a", "b", or "c", the cell is turned on and the bit line is discharged, and the potential of the bit line becomes the same as that of the source, i.e., Vx.

After that, the signal BLPRE of the data storage circuit 10 is temporarily set to VSG, the node N3 of TDC is precharged to Vdd, and then the signal BOOST is set to Vdd from Vss. Thereby, the node N3 of the TDC becomes 2Vdd. After that, the signal BLCLAMP is set to (0.45V+Vth+Vx), for example. When the potential of the bit line is lower than 0.45V+Vx, the node N3 of the TDC becomes a low level, and when the potential of the bit line is higher than 0.45V+Vx, the potential remains at a high level. Here, after the signal BOOST is set from Vdd to Vss, the potential of the TDC is read into the PDC by setting the signal BLC1 to the voltage BSG. Accordingly, when the threshold voltage of the cell is lower than the levels "a", "b", and "c", the node N1a of the PDC is at a low level, and when the threshold voltage of the cell is higher, the node N1a of the PDC becomes a high level.

(Programming and Program Verification)

FIG. 11 is a flowchart illustrating the program operation (write operation). The program operation is started by specifying an address and selecting two pages shown in FIG. 2 or 3, for example. In the memory of the present example, writing is performed on the first and second pages simultaneously. The first page data as write data supplied from the outside is stored in the SDCs in all the data storage circuits 10. After that, the data in the SDCs in all the data storage circuits 10 is transferred to the PDC. After that, the data on the second page is stored in the SDCs in all the data storage circuits 10. After that, the data on the second page is stored in all the SDCs in the data storage circuit 10 (S21). After that, data is operated, and data is set in the SDC, PDC, and DDC according to the input data. In this step, when the node N1a of the PDC is "0" (low level), data is written, and when the node N1a of the PDC is "1" (high level), data is not written.

(Program Operation) (S22)

Figure 12:
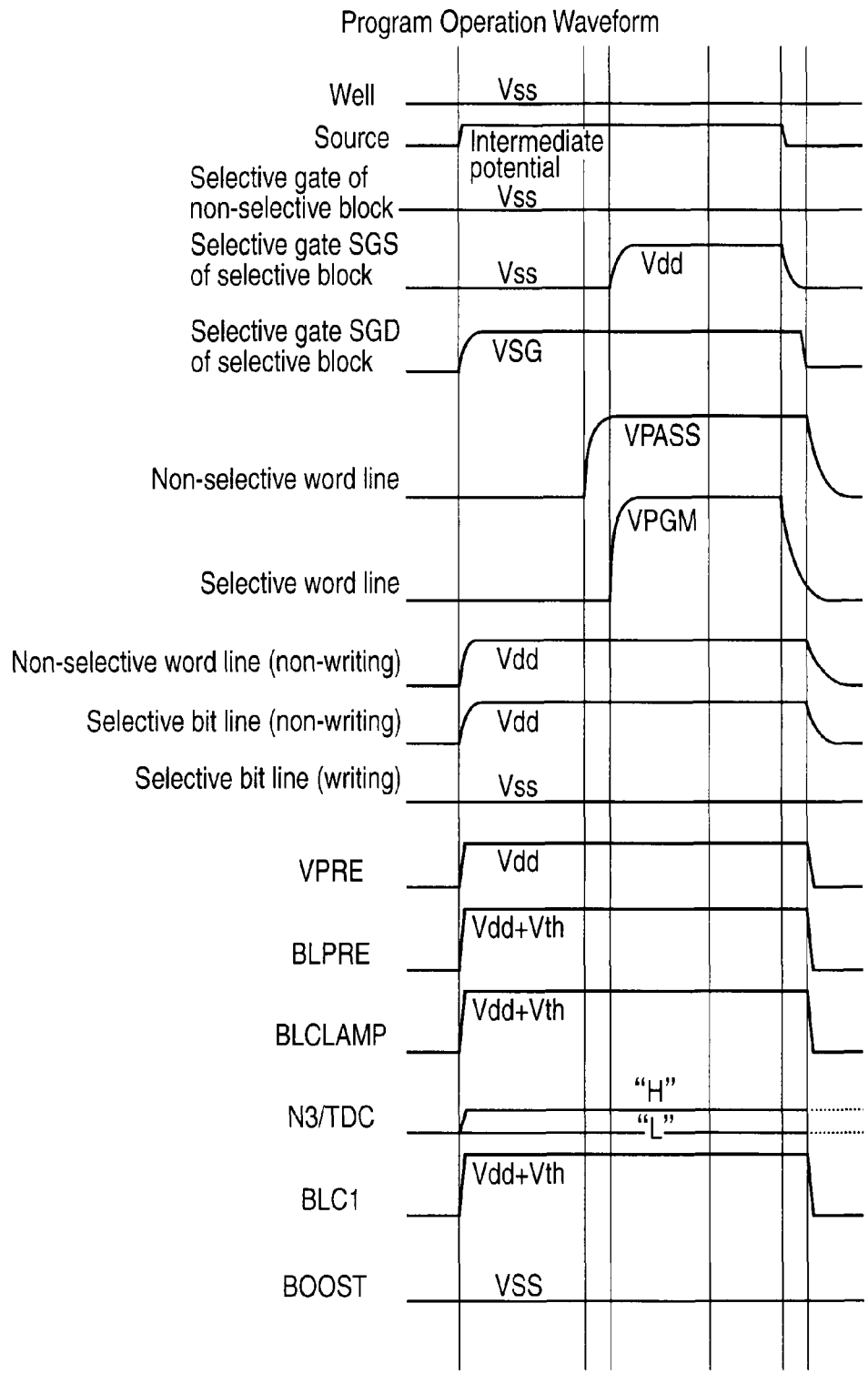
FIG. 12 is a waveform chart illustrating the write operation.

FIG. 12 illustrates a waveform of a program operation. In the above-described state, a signal BLC1 of the data storage circuit 10 is set to the voltage Vdd+Vth. When data "1" is stored in the PDC, the potential of the bit line becomes Vdd, and when data "0" is stored, the potential of the bit line becomes Vss. Further, in the case of FIG. 2, data should not be written into a cell connected to a non-selected word line and on a non-selected page (in which the bit line is not selected). Accordingly, bit lines connected to such cells are also set to Vdd, as in the case where data "1" is stored in the PDC.

Assume that a voltage Vdd is supplied to the select line SG1 of the selected block, a voltage VPGM (20V) is supplied to the selected word line, and a voltage VPASS (10V) is supplied to the non-selected word line. When the bit line is Vss, since the channel of the cell is Vss and the word line is VPGM, writing is performed. When the bit line is Vdd, on the other hand, the channel of the cell is not Vss and the voltage becomes approximately VPGM/2 by increasing VPGM. Accordingly, programming is not performed.

(Program Verify Reading) (S23, S24, S25)

Program verify reading is similar to the read operation, but potentials a', b', c', and d' (a'=0.5V when a=0V) slightly higher than the potentials a, b, c, and d at the time of reading are supplied to the selected word line. Hereinafter, "'" denotes a verify potential, which is a value slightly higher than the potential at the time of reading. As a result of the verify operation, when the voltage reaches the threshold voltage of the target, the node N1a of the PDC of the data storage circuit 10 is set to "1", and is not selected in the next write operation. After that, it is judged whether all the cells have passed the verification using the signal line COMi (S26). As a result thereof, if there is a cell in which writing is not fully performed, a program voltage is slightly stepped up (S27), and programming and program verification are repeated in the same way as above until all the cells pass the verification. After the writing, data on the memory cell becomes data "0", "1", "2", "3", as shown in FIG. 8A.

(Erase Operation)

Figure 13:
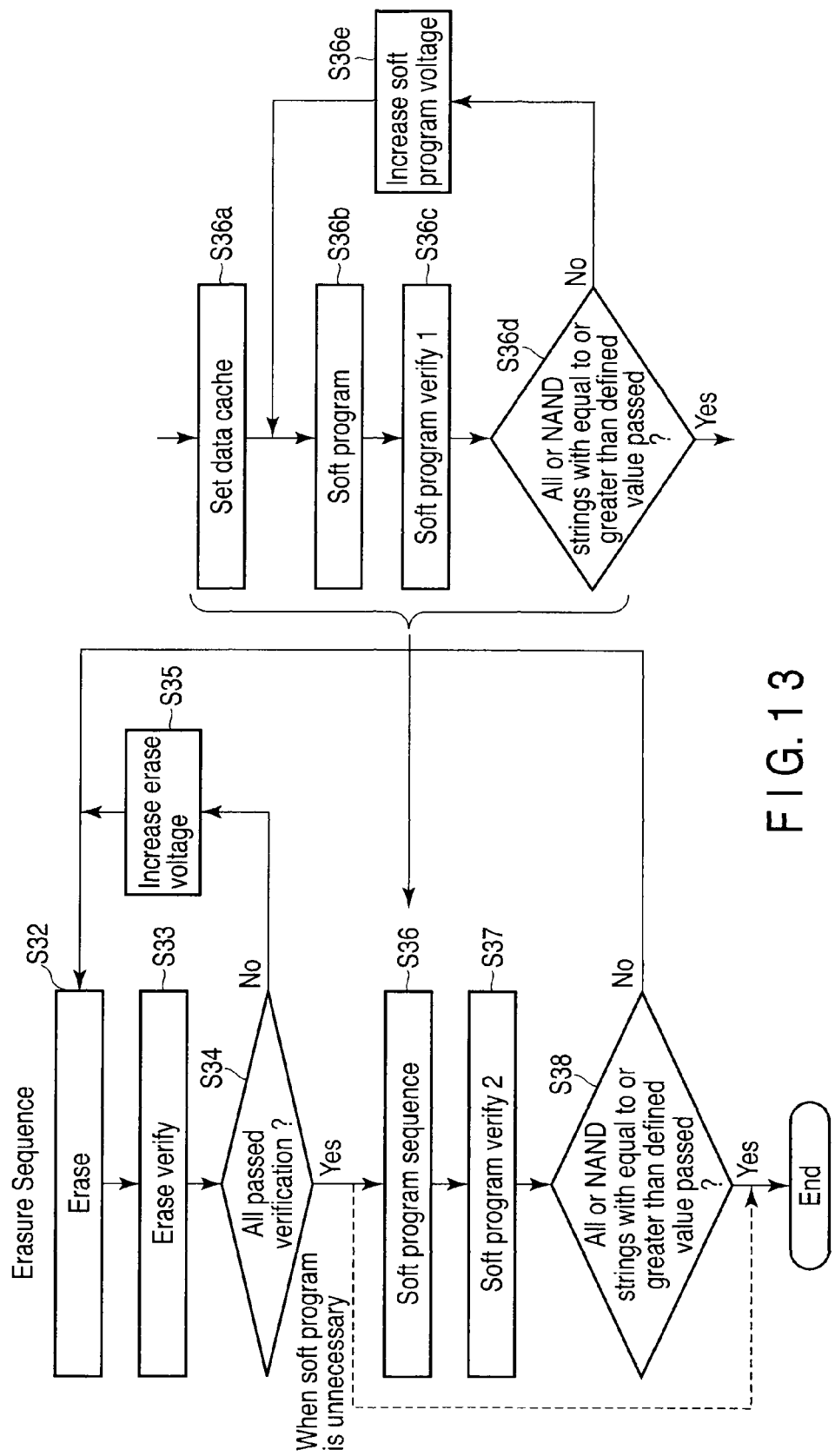
FIG. 13 is a flowchart schematically illustrating a general erase operation.
Figure 14:
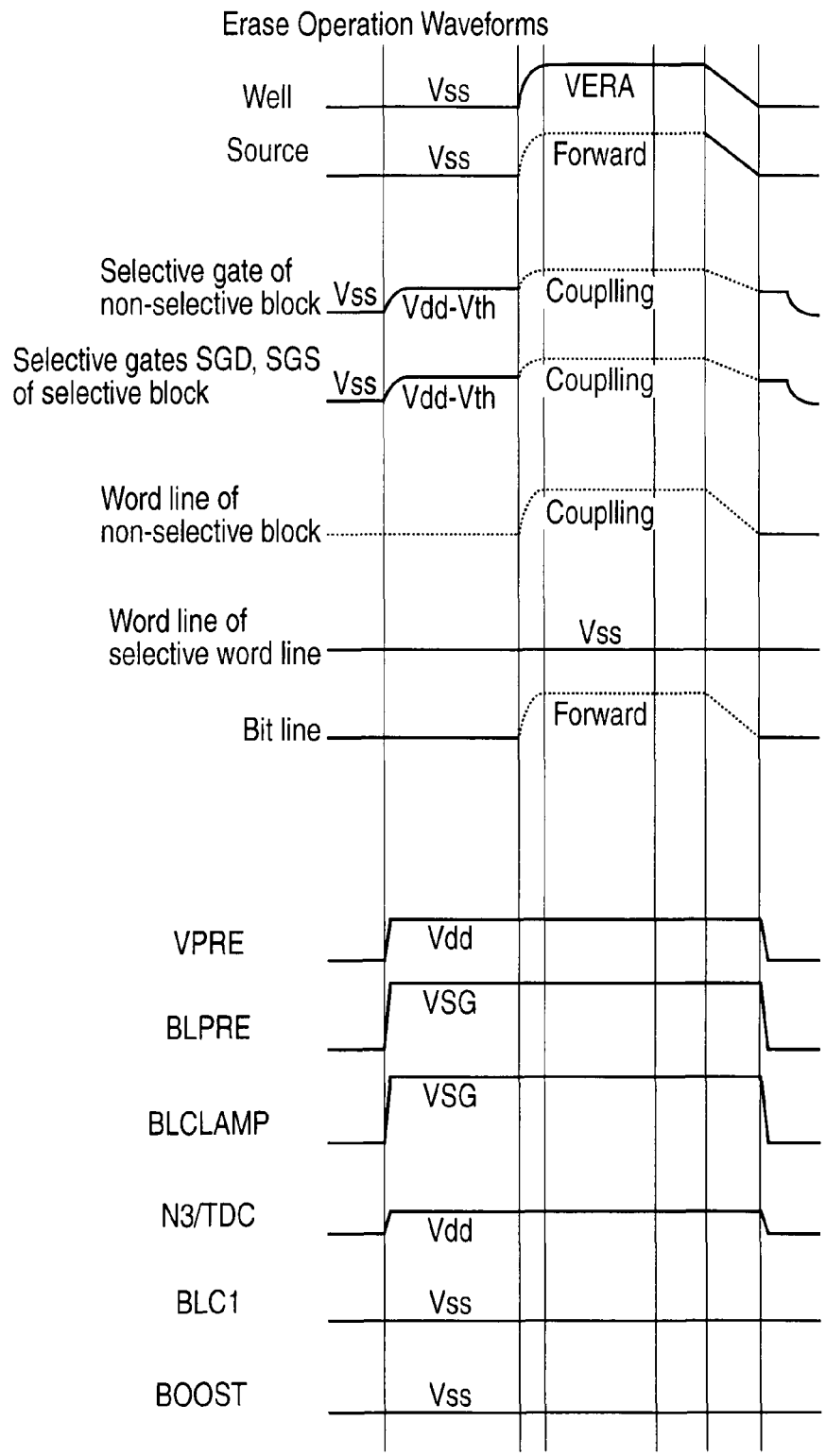
FIG. 14 is a waveform operation illustrating the erase operation.

FIG. 13 is a flowchart illustrating a general erase operation. An erase operation is performed by block units shown by dotted lines in FIG. 2. First, an address is specified, and the specified block is erased (S32). In the erase operation, all the cells in the selected block are erased collectively. FIG. 14 illustrates a timing chart of an erase operation.

Figure 8B:
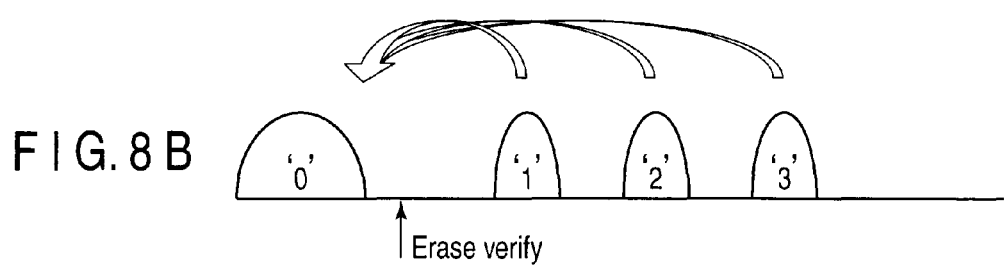
FIG. 8B illustrates the erase verify level.

FIG. 8B illustrates an ideal cell threshold distribution. Thus, after the erasure, the threshold voltage of the cell becomes negative.

Next, the erase verify operation is performed (S33). In this case, the erase verify operation of a source flow method is used to collectively verify all the cells in the selected block.

Figure 15:
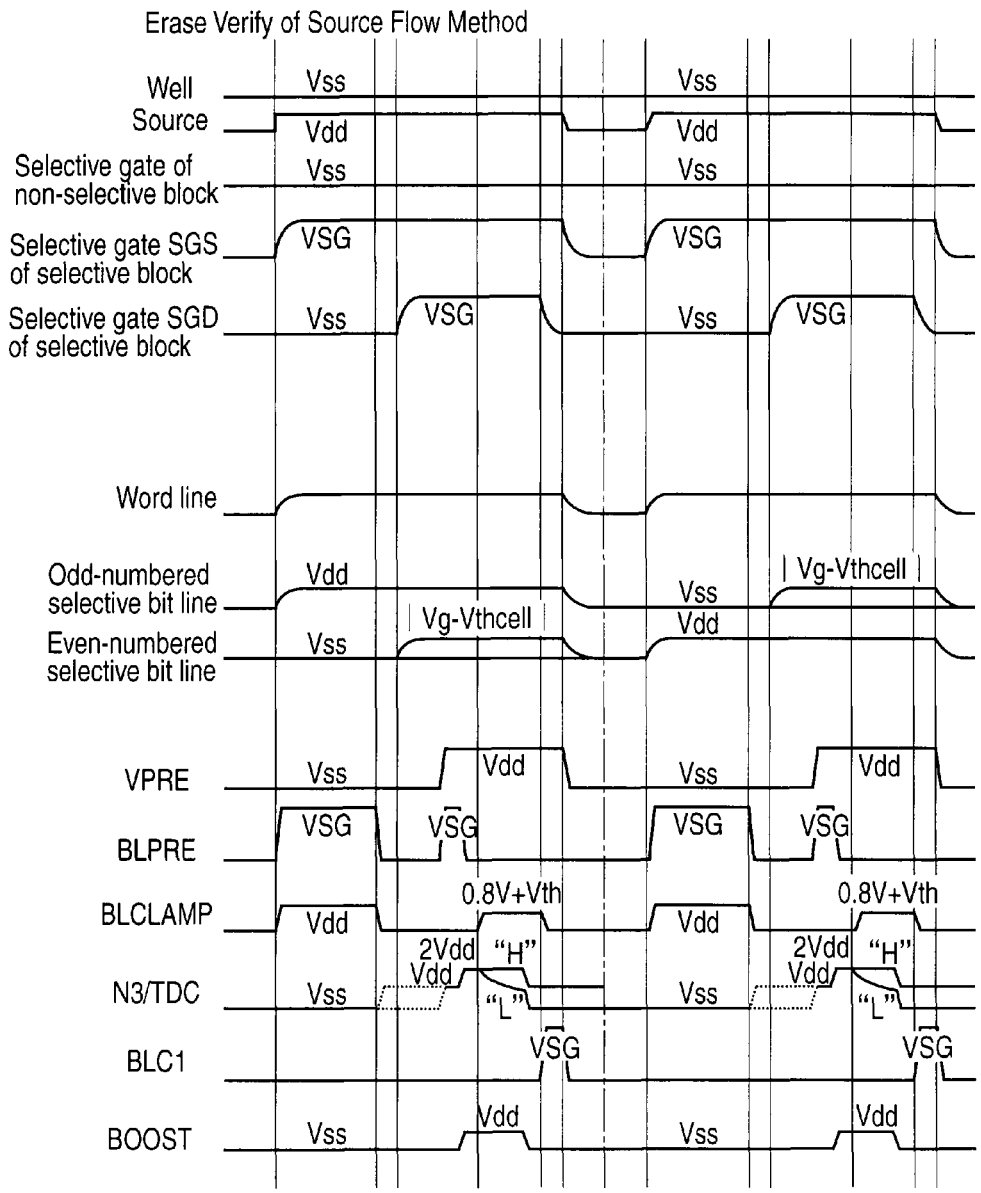
FIG. 15 is a waveform chart illustrating the erase verify operation of a source flow method.
Figure 16:
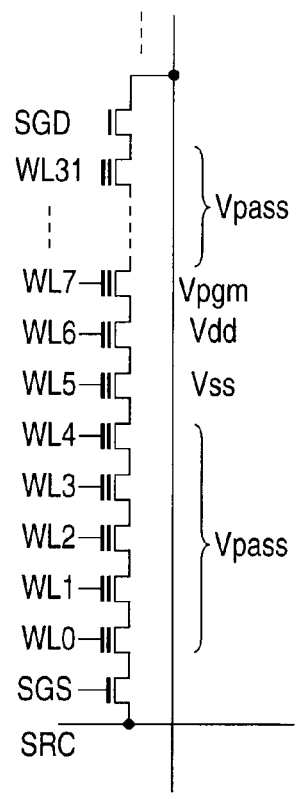
FIG. 16 illustrates a write operation of an erase self boost (EASB) method.

FIG. 15 illustrates a timing chart of an erase verify operation of the source flow method. Referring to FIG. 15, the erase verification of the source flow method will be described.

First, all the cells connected to even-numbered bit lines in the selected block are collectively verified. After that, all the cells connected to the odd-numbered bit lines are collectively verified. More specifically, a voltage according to the verify level is applied to the word line, even-numbered bit lines are set to Vss, odd-numbered non-selected bit lines are set to Vdd, and then the select gates S1, S2 are turned on by setting the source line to Vdd. In this case, when the voltage Vg of the word line is 0V, and the threshold voltages Vthcell of four cells, for example, in a NAND string are −2V, −1.5V, −0.5V and −1V, the potential of the selective bit line becomes |Vg−Vthcell|. Accordingly, 0V−(−0.5V (threshold voltage of a cell having the lowest threshold voltage))=0.5V.

In this case, after the TDC of the data storage circuit 10 is precharged to Vdd, the signal BOOST is set to Vdd from Vss, the node N3 of the TDC is set to a potential of 2Vdd, and then the signal BLCLAMP is set to 0.8V+Vth. Since the level of the bit line is 0.5V, the TDC becomes a low level. After that, the signal BOOST is set to Vss from Vdd, the signal BLC1 is set to VSG, and the low level of the TDC is fetched into the PDC.

When the threshold voltages of a cell in the NAND string are −2V, −1.5V, −1.0V and −1.0V, for example, on the other hand, the potential |Vg−Vthcell| of the selective bit line becomes 0V−(−1V(threshold voltage of the cell with the lowest threshold voltage))=1.0V.

Here, assume that after the TDC of the data storage circuit 10 is precharged to Vdd, the signal BOOST is set to Vdd from Vss, the node N3 of the TDC is set to a potential of 2Vdd, and then the signal BLCLAMP is set to 0.8V+Vth. Since the level of the bit line is 1V, the TDC becomes a high level. After that, the signal BOOST is set to Vss from Vdd, the signal BLC1 is set to VSG, and the high level of the TDC is fetched into the PDC.

That is, when the threshold voltage of the cell is equal to or lower than −0.8V, the PDC becomes "1", and when the threshold voltage of the cell is equal to or greater than −0.8V, the PDC becomes "0". After that, memory cells connected to odd-numbered bit lines are verified as in the case described above (S33). Combining the verification results, it is judged whether all the cells of the selected block have reached the erase verify level (S34). If the cells have not reached the erase verify level, the erase voltage is slightly increased (S35), and the erase operation and the erase verify operation are performed again. Such operations are repeated until all the cells in the selective block reach the erase verify level. After that, a soft program sequence is performed (S36), and the threshold voltage is slightly increased such that the erasure level after the erasure does not become too deep. In the soft program sequence, after a data cache is set (S36a), soft programming (S36b), soft program verification 1 (S36c), and soft program voltage step-up (S36e) are repeated until the all the cells or cells having a value equal to or greater than a defined value of the NAND string reach a soft program verify level (S36d).

This is intended to solve the problem of the case where the erase self boost (EASB) method is adopted at the time of programming. That is, in the EASB method, writing is always performed from the source side. The bit line is set to Vss during writing and is set to Vdd during non-writing. When data is written into a cell connected to the word line WL7, the word lines WL0-WL4 are set to Vpass, the word line WL5 is set to Vss, the word line WL6 is set to Vdd, an intermediate potential, or Vpass, the word line WL7 is set to Vpgm, and the word lines WL8-31 are set to Vpass. In this case, during writing, the gate of the word line WL7 becomes Vpgm, the channel becomes Vss, and writing is performed. However, if the erasure level of the cell connected to the word line WL5 to which data is written prior to the memory cell connected to the word line WL7 is too deep, the cell is not turned off even if the word line WL5 is set to Vss, the potential of the channel of the cell to which Vpgm is applied will increase, and the cell cannot be set as non-writing. In order to prevent such a case, a soft program operation is performed by setting all the word lines in a selected state after the erase operation.

After that, as shown in FIG. 13, soft program verification is performed on all the NAND strings (S36). The soft program verification is similar to the above-described erase verify operation. However, the level of the soft program verification is lower than the erase verify level of −0.8V, i.e., −0.5V, for example. Accordingly, the potential of the word line is set to 0.3V, or the signal BLCLAMP is set to 0.5V.

Figure 8C:
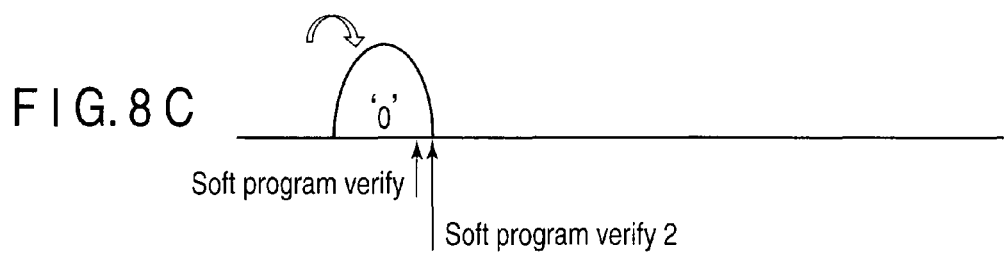
FIG. 8C illustrates the soft program verify level.

Further, as shown in FIG. 8C, if the cell with the lowest threshold voltage in the NAND string has exceeded the soft program verify level in the soft program verification, the cell is set to non-writing in the next soft programming. Thus, writing is performed such that all the cells or cells with a value equal to or greater than a defined value of the NAND string exceed the soft program verify level. After that, the level of the soft program verification is further increased to the soft program verification 2, and it is confirmed that the levels of all the cells are equal to or lower than the soft program verification 2. As a result, if the verification has not been passed, an erase operation is performed again. The soft program operation does not necessarily need to be performed during the erasure, and the level "0" may be written during the programming. Of course, the soft programming can be omitted if unnecessary. Further, while the erase verify operation and the soft program operation in the present embodiment are of the source flow method, they may be performed in the same way as the usual read and verify operations shown in FIG. 10. In that case, all the word lines, half the number of the word lines, or a plurality of word lines in a block are selected and it is judged whether the cells in the selected block reach a predetermined level.

First Embodiment

Figure 17A:
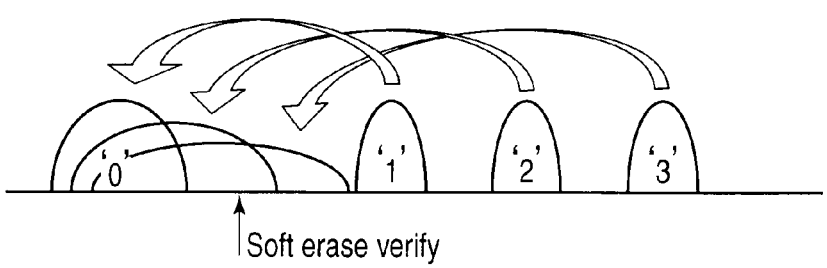
FIG. 17A illustrates transition of threshold voltages of a memory cell according to the first embodiment.
Figure 17B:
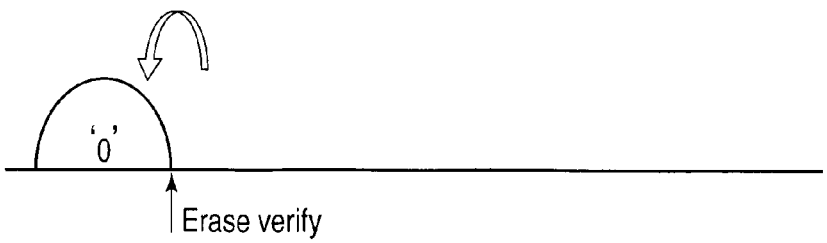
FIG. 17B illustrates an erase verify level.
Figure 18:
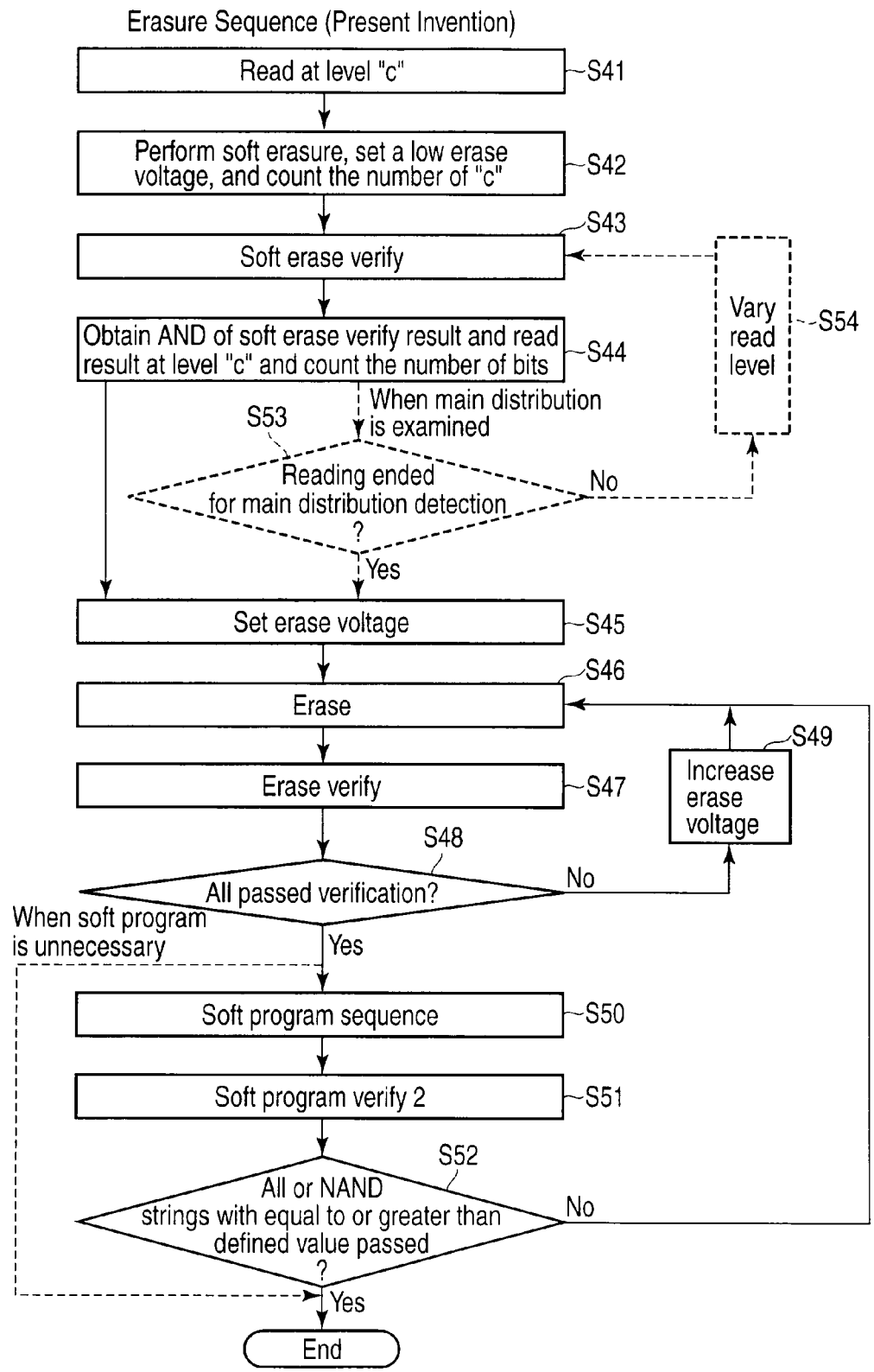
FIG. 18 is a flowchart illustrating an erase operation according to a first embodiment.

FIG. 17 shows transition of the threshold voltage of the memory cell in the first embodiment, and FIG. 18 shows an erasure sequence according to the first embodiment.

As shown in FIG. 17A, the threshold voltage after the erasure depends on the threshold voltage written into the cell before the erasure. That is, when the threshold voltage of the cell before the erasure is high, the threshold voltage after the erasure is also high, and when the threshold voltage of the cell before the erasure is low, the threshold voltage after the erasure tends to be low as well. In particular, this tendency is prominent when the erase voltage is small. Accordingly, in the first embodiment, the distribution state of the threshold voltages of the memory cells is monitored by a read operation, the distribution state of the threshold voltages of the memory cells after the soft erasure is monitored, and an erase voltage is set based on these monitored results.

As shown in FIG. 18, data is read from a memory cell using the level "c" shown in FIG. 8A (S41). As a result, when data "3" is written into the memory cell, the node N1a of the PDC of the data storage circuit 10 becomes "1", and when data other than data "3" is written, the node N1a of the PDC becomes "0". After that, using a low erase voltage, soft erasure is performed on the selected block. Along with the erase operation, the number of PDCs set to "1" is counted (S42). This counting operation should preferably be performed during the soft erasure, since the time required for the erasure sequence can be reduced thereby, but the counting operation may be performed before the soft erasure.

After that, soft erase verification is performed (S43). The soft erase verification is the same as the read operation, for example, but the level of the word line is set to the level of the soft erase verification. As shown in FIG. 17A, the level of the soft erase verification is set to a level slightly higher than the level of the erase verification shown in FIG. 17B, for example.

The result of the soft erase verification is stored in the PDC. That is, the result of the soft erase verification and AND of the data on the PDC read at the level "c" are fetched. As a result, data "3" is written before the soft erasure, and only the PDC of the cell that was not fully erased in the soft erasure becomes "1". In this step, the number of PDCs that have become "1" is counted (S44). After that, when the number of PDCs in which data "3" is written into the memory cell is "x", and when the number of PDCs in which data "3" is written before the soft erasure and has not been fully erased by the soft erasure is "y", "y/x" is calculated.

Further, when AND of data obtained by reversing the read result at level "c" and data on the PDC in which the soft erase verification is stored is calculated, only the PDC written into data "3" before the soft erasure and corresponding to the cell erased by the soft erasure becomes "1". In this step, the number of PDCs set to "1" is counted. Such a configuration is also possible.

Based on the counted result ("y/x"), an erase voltage is set (S45), and the next erase operation is performed (S46). That is, if the calculated result is greater than a reference value, for example, the erase voltage is set high, and if the calculated result is smaller than the reference value, the erase voltage is set low. The erasure, erase verification, soft programming, and the like shown in S46-S52 in FIG. 18 are similar to the erasure sequence shown in FIG. 13. Further, the soft programming can be omitted, if unnecessary, as in the case of the erasure sequence shown in FIG. 13.

According to the first embodiment, the distribution state of the threshold voltages of the memory cells is monitored by the read operation, the distribution state of the threshold voltages of the memory cells after the soft erasure is monitored, and an erase voltage is set based on the monitored results. Thus, the erase voltage can be precisely set without depending on the threshold voltage distribution of the memory cell before the erasure. Accordingly, the number of times of loops of the erasure sequence can be reduced, and thereby the time required for the erasure can be reduced.

FIG. 21 illustrates an operation of the first embodiment, and shows that the erase voltage can be precisely set and the number of times of application of the erase voltage can be suppressed, by performing a read operation before the soft erasure and then performing the soft erase operation and the soft erase verification before the soft erasure.

In the above-described embodiment, in step S44, the erase voltage is set based on the result obtained by calculating the number of PDCs that are "1". However, as shown in FIG. 17A, the threshold voltage distribution after the soft erasure expands in a broad range, corresponding to data "1", "2", "3", for example. Accordingly, the result of the soft erase verification may not correspond to the main distribution (center) of the threshold voltage distribution.

Accordingly, as shown by the dashed line in FIG. 18, the erase voltage can be precisely set by obtaining the maximum value of the counted value by varying the level of the verification read and repeating the counting of the number of cells that have been written into the level "c" before the soft erasure, and detecting the main distribution of the threshold voltage distribution. In this case, when the verify level is varied from 0V to 1.6V in increments of 0.1V, and the main distribution is detected, the counting must be repeated (1.6V−0V)/0.1=16 times. In order to enhance the speed, a bisection method may be used as well. In that case, the following can be known: reading is started at 0.8V; when the number of cells of equal to or greater than 0.8V is large, reading is performed at 1.2V; when the number of cells of equal to or greater than 0.8V and equal to or lower than 1.2V is greater than the number of cells of equal to or greater than 1.2V and equal to or lower than 1.6V, reading is performed at 1.0V; when the number of cells of equal to or greater than 1.0V and equal to or lower than 1.2V is larger than the number of cells of equal to or greater than 0.8V and equal to or lower than 1.0V, reading is performed at 1.1V; and when the number of cells of equal to or greater than 1.1V and equal to or lower than 1.2V is larger than the number of cells of equal to or greater than 1.0V and equal to or lower than 1.2V, the main distribution is equal to or greater than 1.1V and equal to or lower than 1.2V. Thus, by using a bisection method, the repetition needs to be performed only four times.

In the present embodiment, the number "a" of memory cells that have exceeded the first read level has been calculated before the soft erasure, but as shown in Patent Document 4, if the threshold voltage distribution is obtained after the soft erasure when the number "a" of cells exceeding the first read level before the soft erasure does not need to be counted, the processing speed can be enhanced by using the above-described bisection method.

The read operation, the soft erase verification, the weak verification, and the soft program verification using the level "c" before the soft erasure may be performed using a specific number of word lines, for example, or verify reading may be performed on all the word lines collectively. Alternatively, only a specific number of word lines, or some or all the word lines may be subjected to verify reading one by one, and a value obtained by accumulating the read results may be used as well. Of course, the reading method before the soft erasure and the erase verify read method after the soft erasure may be varied as well. Further, the erase verification of the source flow method may be performed collectively on a NAND string, or by dividing a portion of the NAND string. Moreover, it may be performed simultaneously with the usual reading and program verify reading.

Second Embodiment

Figure 19:
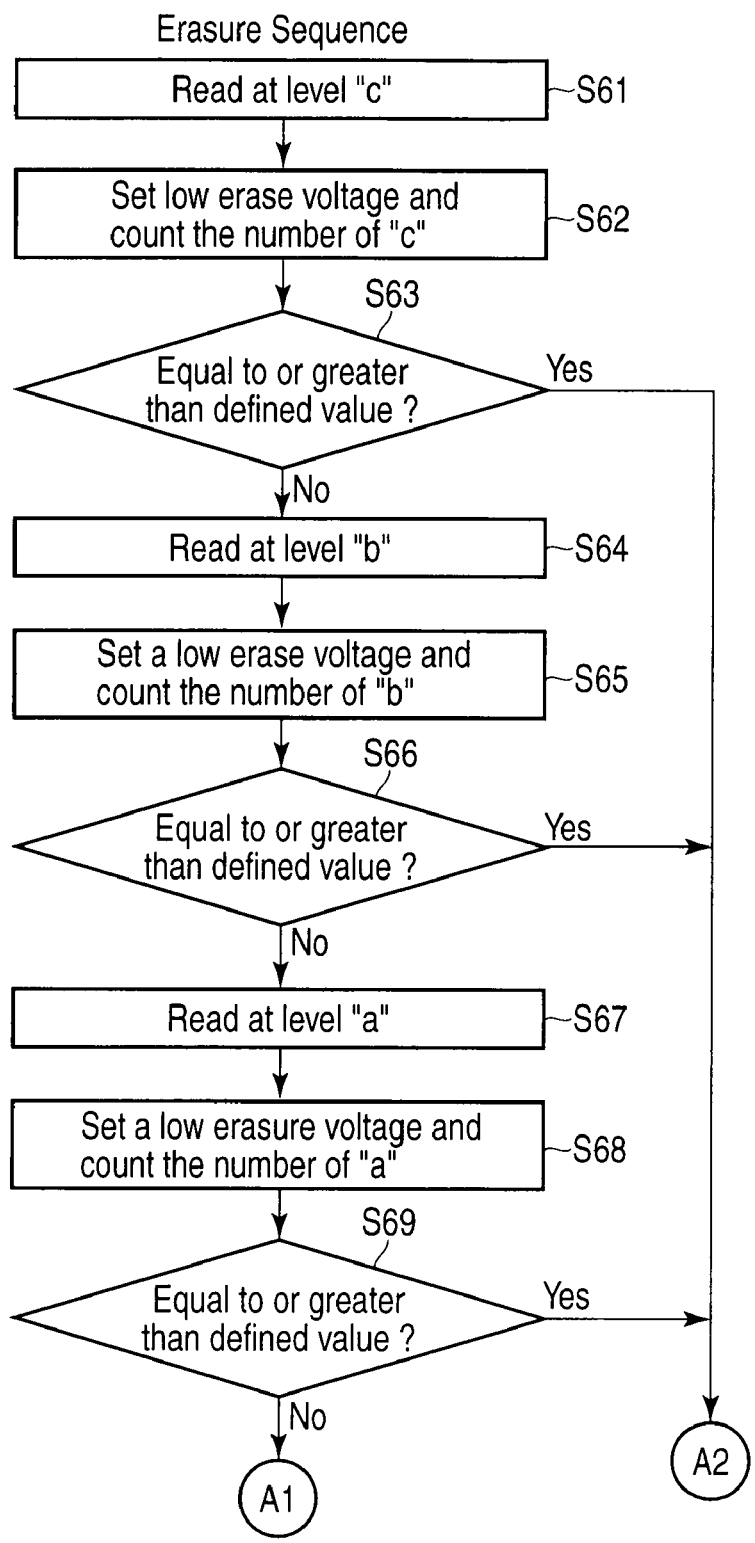
FIG. 19 is a flowchart illustrating a portion of an erase operation according to a second embodiment.

FIGS. 19 and 20 illustrate an erasure sequence according to the second embodiment.

In the first embodiment, data of the memory cells is read at level "c" before the soft erasure, and the number of PDCs with data "1" is calculated.

In the second embodiment, on the other hand, data on the memory cell is read at level "c", for example (S61), and the number of cells written into the threshold voltage distribution of "3" is counted (S62), as in the case of the first embodiment. After that, the counted value is compared with the defined value (S63). As a result, if the calculated value is equal to or lower than a defined value, data on the memory cell is read at level "b" (S64), and the number of cells written into the threshold voltage distribution of "2" is counted (S65), as in the case of the level "c". After that, the counted value is compared with the defined value (S66). As a result, if the counted value is equal to or lower than a defined value, data on the memory cell is read at level "a" (S67), and the number of cells written into the threshold voltage distribution of "1" is counted (S68). After that, the counted value is compared with the defined value (S69). If the number of cells written into the threshold voltage distribution of "1" is equal to or lower than a defined value, it shows that the number of erasure cells is large. Accordingly, the erase voltage is set according to this state (S70). That is, in this case, as shown in FIG. 20, a low erase voltage is set and the cell is erased (S74, S75), for example, or the sequence is ended without erasing the cell.

When the counted values are equal to or greater than a defined value in steps S63, S66, S69, on the other hand, a soft erasure S70a shown in FIG. 20 is performed. The soft erase voltage in this step may be set to a voltage according to each of the cases where the number of cells written into the threshold voltage distribution of "3" is equal to or greater than a defined value, where the number of cells written into the threshold voltage distribution of "2" is equal to or greater than a defined value, and where the number of cells written into the threshold voltage distribution of "1" is equal to or greater than a defined value. That is, if the number of cells written into the "3" threshold voltage distribution is equal to or greater than a defined value, the erase voltage is set higher, and if the number of cells written into the "1" threshold voltage distribution is equal to or greater than a defined value, the erase voltage is set low.

After that, soft erase verification is performed (S70). That is, soft erase verification is performed according to the level "c" if the number of cells written into the threshold voltage distribution of "3" is equal to or greater than a defined value, according to the level "b" if the number of cells written into the threshold voltage distribution of "2" is equal to or greater than a defined value, and according to level "a" if the number of cells written into the threshold voltage distribution of "1" is equal to or greater than a defined value (S70). As a result, in the PDC of the data storage circuit 10, the result of the soft erase verification, AND data of the data on the PDC read at the level "c" or the result of the soft erase verification, AND data of the PDC data read at the level "b" or the result of the soft erase verification, and AND data of the PDC data read at the level "a" are held. Among these, the number of PDCs with data "1" is calculated (S71). That is, as in the case of the first embodiment, "y/x" is calculated if the number of cells written into a threshold distribution before soft erasure is "x", and the number of cells written into the threshold distribution before the soft erasure and have not been fully erased by the soft erasure is "y". Based on the calculated result ("y/x"), an erase voltage is set (S74), and the next erase operation is performed (S75).

That is, if the counted result is equal to or greater than a reference value, for example, the erase voltage is set high, and if the counted result is smaller than the reference value, the erase voltage is set low. The erasure, erase verification, the soft programming, and the like shown in S75-S81 of FIG. 20 are similar to the erasure sequence shown in FIG. 13. Further, the soft programming may be omitted, if unnecessary, as in the case of the erasure sequence shown in FIG. 13.

According to the second embodiment, data is read at level "c" before the soft erasure, and the number of cells that are written into the threshold voltage distribution of one of the levels "c", "b", and "a" and that have become equal to or lower than the level of the soft erase verification is monitored, and an erase voltage is set according to the monitored result. Accordingly, if the number of cells written into level "c" before the soft erasure, for example, is extremely small, the erase voltage can be set precisely without depending on the threshold voltage distribution of the memory cell before the erasure. Accordingly, the number of times of loops of the erasure sequence can be reduced, and the time required for the erasure sequence can be reduced.

If data to be written is operated so that each of an erasure level, and data to be written in level "a", level "b" and level "c" may become uniform, the number of the cells written in the level "c" before the soft erasure can be prevented from decreasing extremely.

Further, as shown by the dashed line in FIG. 20, the main distribution of the threshold voltage distribution is detected (S72), and if the threshold voltage distribution is not the main distribution, the level of the verify reading is varied (S73), and the verification and counting operations may be repeated (S54, S43, S44, S53). The main distribution can be detected by obtaining the maximum value of the counted value obtained by varying and counting the level of the verify reading, for example.

Thus, the erase voltage can be set more precisely by reading the verify level of the soft erase verification by varying the level little by little, detecting the main distribution of the originally "3", "2", or "1" threshold voltage distribution, and setting the next erase voltage based on the detected result.

The read operation, the soft erase verification, the erase verification, and the soft program verification using the level "c" before the soft erasure may be performed using a specific number of word lines, for example, or verify reading may be performed collectively on all the word lines. Alternatively, verify reading may be performed on a specific number of word lines, or some or all the word lines, and a value obtained by accumulating the read results may be used as well. Of course, the reading method before the soft erasure and the erase verify read method after the soft erasure may be varied. Furthermore, the erase verification of the source flow method may be performed collectively on the NAND string, or by dividing a portion of the NAND string. Moreover, it may be performed simultaneously with the usual reading and program verify reading.

Further, the erase verify reading after the soft erasure may be performed by performing a verification read operation at a plurality of levels, and determining the next erase voltage according to the read level and the number of erasure cells, without performing a verification read operation at one level. In that case, if the potential of the word line is stepped up in increments of 0.1V, and verification from 0V to 2.0V, the verify operation needs to be performed 21 times. Accordingly, the center of the threshold voltage distribution of the cell can be examined by performing a verify operation by setting the potential of the word line at 1V, which is the center between 0V and 2.0V, and using the bisection method, in which, when the threshold voltage distribution of the cell is lower than the potential (1V) of the word line, the potential of the word line is set to 0.5V, and when the threshold voltage distribution of the cell is higher than the potential (1V) of the word line, the potential of the word line is set to 1.5V.

In the above-described embodiment, the number "a" of memory cells exceeding the first read level before the soft erasure has been calculated. However, as in the embodiment described in Patent Document 4, if the threshold voltage distribution is obtained after the soft erasure, and when the number "a" of memory cells exceeding the first read level before the soft erasure does not need to be counted, the processing speed can be enhanced by using the above-described bisection method.

Third Embodiment

Figure 22:
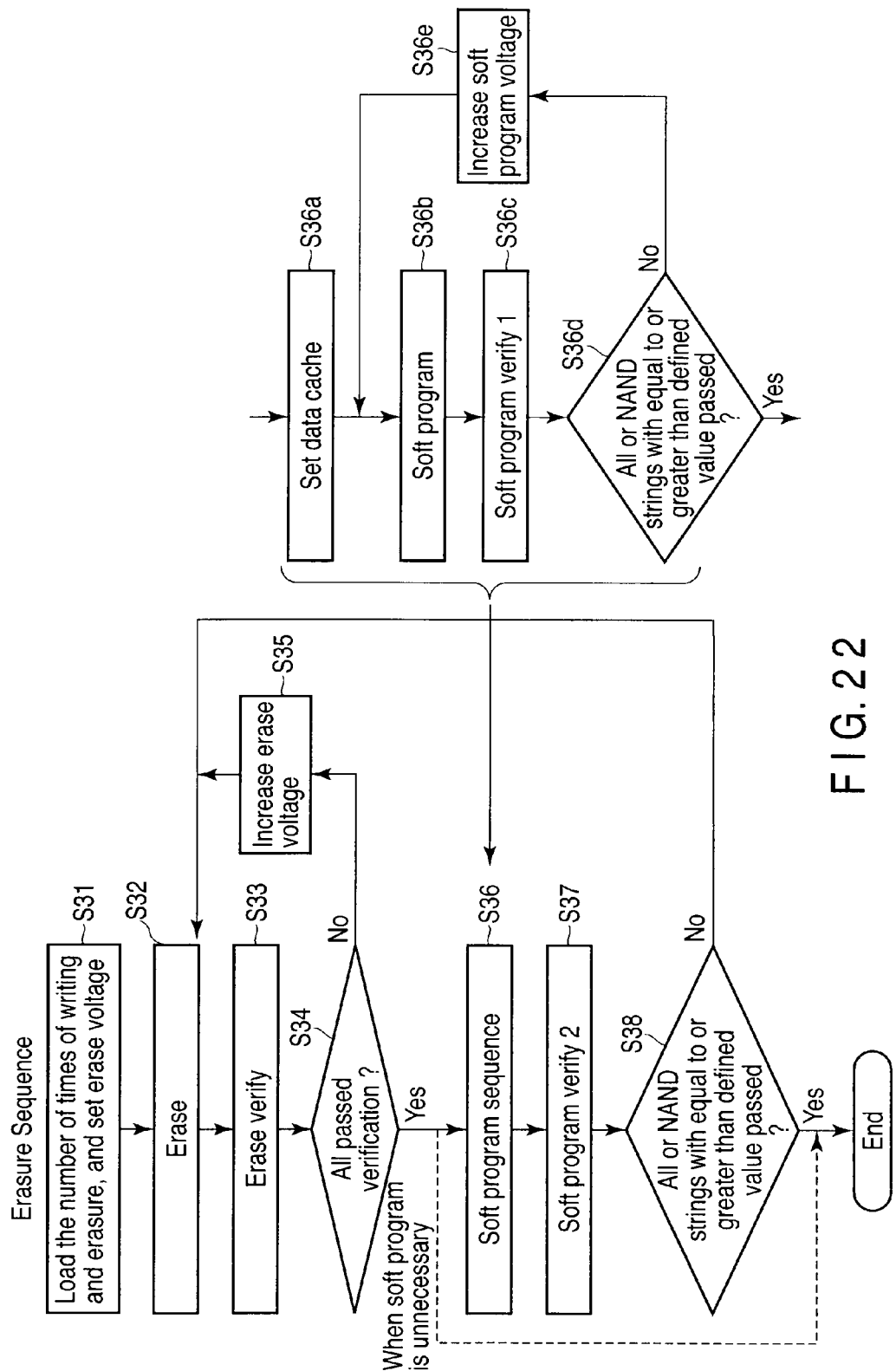
FIG. 22 is a flowchart illustrating an erase operation according to a third embodiment.

FIG. 22 illustrates a third embodiment.

In the first and second embodiments, soft erase verify reading is performed after the soft erasure is performed, the threshold voltage of the cell is examined, and the next erase voltage is determined according to the result. However, memory cells of NAND flash memories have the characteristic of being difficult to be written and easily erased when the number of times of writing erasure is small, and have the characteristic of being easily written and difficult to be erased when the number of times of writing erasure is large. Accordingly, the erase voltage may be determined according to the number of times of writing and erasure.

The number of times of writing and erasure may be managed by the controller connected to the NAND flash memory, or the number of times of writing and erasure of all the blocks may be stored and managed in a specific block of the NAND flash memory. Further, the page length of each of the blocks may be expanded such that the number of times of writing and erasure can be stored in the expanded region, and the written data and the number of times of writing and erasure may be simultaneously written in the writing sequence of usual pages. Moreover, after the erase operation of the usual erasure sequence, the number of times of writing and erasure may be written into the expanded region.

The erasure sequence shown in FIG. 22 is approximately the same as the erasure sequence shown in FIG. 13. However, there is a step S31, in which, before the erase operation, the number of times of writing and erasure is loaded, and an erase voltage is set according to that number of times.

In step S31, when the number of times of writing and erasure is small, for example, the erase voltage is set to a low voltage (such as 20V), and when the number of times of writing and erasure is large, the erase voltage is set to a high voltage (such as 24V). After that, an erase voltage is performed.

According to the third embodiment, an erase voltage can be precisely set. Thereby, the number of times of loops in the erasure sequence can be reduced, and the time required for the erasure sequence can be reduced.

In the first embodiment (FIG. 18) and the second embodiment (FIGS. 19 and 20), the number of memory cells "a" which is exceeding the first-read level has been counted before soft-erase. Moreover, in FIG. 13 and the third embodiment (FIG. 22), erase operation was performed to the beginning in the erasure sequence. However, electrons etc. which is trapped in the floating gate can be eliminated and over erase can be prevented by performing a preliminary writing by selecting all the word lines or selecting half of the word lines alternately before performing the erase operation. The preliminary writing before erasure of soft-erase operation does not shift threshold value voltage greatly. Thus, it is possible to count the number of memory cells which is exceeding the first-read level before performing the soft-erase operation and before or after read operation like the first embodiment (FIG. 18) and the second embodiment (FIGS. 19 and 20). Needless to say, also in FIG. 13 and the third embodiment (FIG. 22), it is possible to perform preliminary writing before erasure or soft-erase operation. In the above mentioned embodiments, a memory cell stores one of four levels data, however, these embodiments can be applied to memory cell which stores two levels, eight levels, or sixteen levels.

It is also possible to perform the first, second, and third embodiments and Reference Document 4 in combination. In particular, according to the number of times of writing and erasure of the NAND flash memory, the threshold voltage distribution differs, as well as the writing and erasure characteristics. Accordingly, the next erase voltage is determined by combining information on the number of times of writing and erasure and information on the result obtained by performing a soft erase verify reading and examining the threshold voltage of the cell. The soft erase voltage is set based on the information on the number of times of writing and erasure, soft erase verify reading is performed after performing soft erasure, and the next erase voltage is determined using the information obtained as a result of the threshold voltage examination in combination, for example. Thereby, the erase voltage can be optimized, and the time required for the erasure sequence can be reduced.

Moreover, the embodiments perform the soft erase verify reading after one soft-erasure and determine a next erase voltage, and then perform a plurality of the erase operation and the erase verify operation. The memory cell has the characteristic that is hard to be erased when the number of writing and erasure become increase. For this reason, soft erase is not performed only once, but soft erase and soft erase verify reading are repeated two or more times and when a threshold voltage of a predetermined cell becomes lower than the threshold voltage of soft erase verify, it is also possible to decide the next erase voltage by the number of times of soft erase verify reading. Of course, the erase voltage is made to step up, when repeating soft erase and soft erase verify reading and repeating erasure and erase verify reading. In addition, step-up voltages of soft erase and erasure can be different levels, respectively.

Furthermore, the erase voltage (a first erase voltage) supplied to cells first is the erase voltage according to the writing and the number of times of erasure of the memory cells. The erase voltage (a second erase voltage) supplied to cells second is the erase voltage according to "k/a" or "k/b", and/or according to the erase voltage the number of times of writing and erasure of the memory cells. Where "a" is the number of memory cells exceeding the first read level, "k" is the number of the cells which are exceeding the first verify level included in the number "a", "b" is the number of memory cells exceeding the second read level, and "h" is the number of the cells which are exceeding the second verify level included in the number "b".

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a memory cell array including a plurality of memory cells connected to a plurality of word lines and a plurality of bit lines and arranged in a matrix; and
a control circuit configured to control a potential of each of said plurality of word lines and said plurality of bit lines, wherein
the control circuit reads data from a memory cell connected to a selected word line at a first read level before an erase operation, calculates a number "a" of memory cells exceeding the first read level, simultaneously erases n number of memory cells (where n is a natural number equal to or greater than 2) included in said plurality of memory cells of the memory cell array using a first erase voltage during an erase operation, performs a verify operation at a first verify level, obtains a number k (k<=a) of cells (where k is a natural number equal to or greater than 1) included in the number "a" and exceeding the first verify level, determines a second erase voltage based on the number "k/a", and performs a second erase voltage using the second erase voltage.

2. The device according to claim 1, wherein the first erase voltage is an erase voltage set according to a number of times of writing and erasure of the memory cell.

3. The device according to claim 1, wherein the second erase voltage is an erase voltage set according to the number of times of writing and erasure of the memory cell.

4. The device according to claim 1, wherein one of first, second through n-th threshold voltages (n is a natural number equal to or greater than 3) is written to the memory cell at write operation, and data simultaneously written to a plurality of memory cells is operated so that the number of the first, second, through n-th threshold voltages become equal.

5. The device according to claim 1, wherein before performing the erase operation, a preliminary writing is performed to the memory cell by selecting all the word lines or selecting half of the word lines alternately.

6. A semiconductor storage device, comprising:
a memory cell array including a plurality of memory cells connected to a plurality of word lines and a plurality of bit lines and arranged in a matrix; and a control circuit configured to control a potential of each of said plurality of word lines and said plurality of bit lines, wherein the control circuit reads data from a memory cell connected to a selected word line at a first read level before an erase operation, calculates a number "a" of memory cells exceeding the first read level, simultaneously erases n number of memory cells (where n is a natural number equal to or greater than 2) included in said plurality of memory cells of the memory cell array using a first erase voltage during an erase operation, performs a verify operation at a first verify level, calculates a number k (k<=a) of cells (where k is a natural number equal to or greater than 1) included in the number "a" and exceeding the first verify level, determines a second erase voltage according to the number "k/a", calculates a number "a" of memory cells exceeding the first read level, reads data from a memory cell connected to a selected word line at a second read level when the number "a" is equal to or lower than a defined value, calculates a number "b" of memory cells exceeding the second read level, simultaneously erases n number of memory cells (where n is a natural number equal to or greater than 2) included in said plurality of memory cells of the memory cell array using the first erase voltage before an erase operation, performs a verify operation at a second verify level, obtains a number h (h<=b) of cells (where h is a natural number equal to or greater than 1) included in the number "b" and exceeding the second verify level, determines a second erase voltage according to the number "h/b", and performs a second erase operation using the second erase voltage.

7. The device according to claim 6, wherein the first erase voltage is an erase voltage set according to a number of times of writing and erasure of the memory cell, the second erase voltage is an erase voltage set according to the number of times of writing and erasure of the memory cell.

8. A semiconductor storage device, comprising:
a memory cell array including a plurality of memory cells connected to a plurality of word lines and a plurality of bit lines and arranged in a matrix; and
a control circuit configured to control a potential of each of said plurality of word lines and said plurality of bit lines, wherein
the control circuit reads data from a memory cell connected to a selected word line at a first read level before an erase operation, detects a memory cell exceeding the first read level, simultaneously erases n number of memory cells (where n is a natural number equal to or greater than 2) included in said plurality of memory cells of the memory cell array using a first erase voltage during an erase operation, performs a verify operation at a plurality of verify levels, obtains a threshold voltage distribution after the erase operation using the first erase voltage by calculating a number of memory cells exceeding each of the verify levels with respect to the memory cells exceeding the first read level, determines a second erase voltage based on the threshold voltage distribution, and performs a second erase operation using the second erase voltage.

9. The device according to claim 8, wherein the control circuit detects a center of the threshold voltage distribution.

10. The device according to claim 8, wherein the control circuit detects a center of the threshold voltage distribution using a bisection method.

11. The device according to claim 8, wherein at least one of the first and the second erase voltage is an erase voltage set according to a number of times of writing and erasure of the memory cell.

12. A semiconductor storage device, comprising:
a memory cell array including a plurality of memory cells connected to a plurality of word lines and a plurality of bit lines and arranged in a matrix; and
a control circuit configured to control a potential of each of said plurality of word lines and said plurality of bit lines, wherein
the control circuit reads data from a memory cell connected to a selected word line at a first read level before an erase operation, calculates a number "a" of memory cells exceeding the first read level, reads data from a memory cell, reads data from a memory cell connected to a selected word line at a second read level when the number "a" is equal to or lower than a defined value, detects a memory cell exceeding the second read level, simultaneously erases n (where n is a natural number equal to or greater than 2) number of memory cells included in the memory cells of the memory cell array using a first erase voltage during an erase operation, performs a verify operation at a plurality of verify levels, obtains a threshold voltage distribution after an erase operation using a first erase voltage by calculating a number of memory cells exceeding each of the verify levels with respect to the memory cell exceeding the second read level, determines a second erase voltage based on the threshold voltage distribution, and performs a second erase operation using the second erase voltage.

13. The device according to claim 12, wherein the control circuit detects a center of the threshold voltage distribution.

14. The device according to claim 12, wherein the control circuit detects a center of the threshold voltage distribution using a bisection method.

15. The device according to claim 12, wherein the first erase voltage is an erase voltage set according to a number of times of writing and erasure of the memory cell.

16. The device according to claim 12, wherein at least one of the first and the second erase voltage is an erase voltage set according to a number of times of writing and erasure of the memory cell.

17. A semiconductor storage device, comprising:
a memory cell array including a plurality of memory cells connected to a plurality of word lines and a plurality of bit lines and arranged in a matrix; and
a control circuit configured to control a potential of each of said plurality of word lines and said plurality of bit lines, wherein
the control circuit performs an erase operation by setting an erase voltage according to a number of times of writing and erasure of the memory cell before the erase operation.

18. The device according to claim 17, wherein the erase voltage is a first erase voltage when the number of times of writing and erasure is a first number of times, and the erase voltage is a second erase voltage when the number of times of writing and erasure is a second number of times (first number of times<second number of times), the second erase voltage being higher than the first erase voltage.

19. The device according to claim 17, wherein the number of times of writing and erasure of the erase cell is stored in the semiconductor storage device.

20. A semiconductor storage device, comprising:
a memory cell array including a plurality of memory cells connected to a plurality of word lines and a plurality of bit lines and arranged in a matrix; and
a control circuit configured to control a potential of each of said plurality of word lines and said plurality of bit lines, wherein
the control circuit sets a first erase voltage according to a number of times of writing and erasure of the memory cell before an erase operation, simultaneously erases n number of memory cells (where n is a natural number equal to or greater than 2) included in said plurality of memory cells of the memory cell array using the first erase voltage, performs a verify operation at a first verify level, obtains a number k of cells exceeding the first verify level (where k is a natural number equal to or greater than 1), determines a second erase voltage based on the number "k", and performs a second erase operation using the second erase voltage.

21. The device according to claim 20, wherein the second erase voltage is an erase voltage set according to a number of times of writing and erasure of the memory cell.

22. A semiconductor storage device, comprising:
a memory cell array including a plurality of memory cells connected to a plurality of word lines and a plurality of bit lines and arranged in a matrix; and
a control circuit configured to control a potential of each of said plurality of word lines and said plurality of bit lines, wherein
the control circuit sets a first erase voltage according to a number of times of writing and erasure of the memory cell before an erase operation, simultaneously erases n number of memory cells (where n is a natural number equal to or greater than 2) included in said plurality of memory cells of the memory cell array using the first erase voltage, performs a verify operation at a plurality of verify levels, obtains a threshold voltage distribution after an erase operation using the first erase voltage, determines a second erase voltage based on the threshold voltage distribution, and performs a second erase operation using the second erase voltage.

23. The device according to claim 22, wherein the second erase voltage is an erase voltage set according to the number of times of writing and erasure of the memory cell.

* * * * *